United States Patent
Xu et al.

(10) Patent No.: US 11,159,295 B2
(45) Date of Patent: Oct. 26, 2021

(54) PHYSICAL BROADCAST CHANNEL DESIGN FOR POLAR CODES

(71) Applicant: Qualcomm Incorporated, San Diego, CA (US)

(72) Inventors: Changlong Xu, Beijing (CN); Liangming Wu, Beijing (CN); Kai Chen, Shenzhen (CN); Chao Wei, Beijing (CN); Hao Xu, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 106 days.

(21) Appl. No.: 16/645,815

(22) PCT Filed: Aug. 27, 2018

(86) PCT No.: PCT/CN2018/102485
§ 371 (c)(1),
(2) Date: Mar. 10, 2020

(87) PCT Pub. No.: WO2019/047736
PCT Pub. Date: Mar. 14, 2019

(65) Prior Publication Data
US 2020/0259611 A1     Aug. 13, 2020

(30) Foreign Application Priority Data
Sep. 11, 2017    (WO) ................ PCT/CN2017/101194

(51) Int. Cl.
*H04L 5/00*      (2006.01)
*H04L 1/00*      (2006.01)
(52) U.S. Cl.
CPC .......... *H04L 5/0053* (2013.01); *H04L 1/0041* (2013.01); *H04L 1/0045* (2013.01);
(Continued)

(58) Field of Classification Search
CPC ..... H04L 5/001; H04L 5/0053; H04L 1/0041; H04L 1/0045; H04L 1/0054
See application file for complete search history.

(56) References Cited

U.S. PATENT DOCUMENTS 10,498,481 B2 * 12/2019 Wu ......................... H04L 1/007
2013/0100905 A1   4/2013 Pan et al.
(Continued)

FOREIGN PATENT DOCUMENTS

WO    WO-2015026148 A1    2/2015

OTHER PUBLICATIONS

Ericsson: "Summary of Email Discussion [89-15] Details for NRPBCH Evaluation", 3GPP TSG RAN WG1 Meeting #89, 3GPP Draft; R1-1709868, 89-15 Summary of NR-PBCH Evaluation Phase 2, 3rd Generation Partnership Project (3GPP), Mobile Competence Centre; 650, Route Des Lucioles; F-06921 Sophia-Antipolis, Cedex; France, vol. RAN WG1, No. Hangzhou, China; May 15, 2017-May 19, 2017, Jun. 22, 2017, (Jun. 22, 2017), pp. 1-15, XP051304179, Retrieved from the Internet: URL: http://www.3gpp.org/ftp/tsg_ran/WG1_RL1/TSGR1_89/Docs/ [retrieved on Jun. 22, 2017] the whole document.

(Continued)

*Primary Examiner* — Kevin C. Harper
(74) *Attorney, Agent, or Firm* — Holland & Hart LLP

(57) ABSTRACT

Methods, systems, and devices for wireless communications are described. In some wireless communications systems, a base station may implement polar coding to generate codewords for transmission, for example, in a physical broadcast channel (PBCH). The base station may identify a subset of the bandwidth allocated for PBCH transmission (e.g., corresponding to a bandwidth for a synchronization signal), and may assign sub-channels to information bits based on the identified bandwidth subset. The base station may generate (Continued)

a codeword based on the assigned sub-channels, and may map a subset of encoded bits for the codeword to the subset of the bandwidth such that the subset of encoded bits includes bits corresponding to the assigned subchannels for the information bits. A user equipment (UE) may receive the encoded bits in the subset of the bandwidth, and may decode the subset of encoded bits to determine the information bits.

30 Claims, 18 Drawing Sheets

(52) U.S. Cl.
CPC ............ *H04L 1/0057* (2013.01); *H04L 5/001* (2013.01); *H04L 5/0048* (2013.01)

(56) References Cited

U.S. PATENT DOCUMENTS

| | | |
|---|---|---|
| 2015/0091742 A1 | 4/2015 | Ionita et al. |
| 2015/0109948 A1 | 4/2015 | Kim et al. |
| 2017/0222754 A1 | 8/2017 | Noh et al. |
| 2017/0366199 A1* | 12/2017 | Ge .......................... H04L 1/0053 |
| 2018/0076922 A1* | 3/2018 | Zhang .................... H04L 1/0043 |
| 2021/0176739 A1* | 6/2021 | Hui ........................ H04B 7/0695 |

OTHER PUBLICATIONS

Qualcomm Incorporated: "SS Bock Composition and PBCH RE Mapping Design", 3GPP TSG-RAN WG1 Ad-Hoc#2, 3GPP Draft; R1-1711140 SS Bock Composition and PBCH RE Mapping Design, 3rd Generation Partnership Project (3GPP), vol. RAN WG1, No. Qingdao, P.R. China; Jun. 27, 2017-Jun. 30, 2017, pp. 1-6, Jun. 20, 2017 (Jun. 20, 2017), XP051305796, Retrieved from the Internet: URL: http://www.3gpp.org/ftp/tsg_ran/WG1_RL1/TSGR1_AH/NR_AH_1706/Docs/ [retrieved on Jun. 20, 2017] Sections 1-3.
Supplementary European Search Report—EP18855072—Search Authority—Munich—dated Apr. 23, 2021 (176325EP).
International Search Report and Written Opinion—PCT/CN2017/101194—ISA/EPO—dated Jun. 8, 2018 (176325WO1).
International Search Report and Written Opinion—PCT/CN2018/102485—ISA/EPO—dated Nov. 2, 2018 (176325WO2).

* cited by examiner

PHYSICAL BROADCAST CHANNEL DESIGN FOR POLAR CODES

CROSS REFERENCES

The present 371 Application for Patent claims priority to PCT Patent Application No. PCT/CN2018/102485 by Xu et. al., entitled "PHYSICAL BROADCAST CHANNEL DESIGN FOR POLAR CODES," filed Aug. 27, 2018; and to International Patent Application No. PCT/CN2017/101194 by Xu et. al., entitled "PHYSICAL BROADCAST CHANNEL DESIGN FOR POLAR CODES," filed Sep. 11, 2017, each of which is assigned to the assignee hereof.

BACKGROUND

The following relates generally to wireless communication, and more specifically to a self-decodable physical broadcast channel (PBCH) design for polar codes.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as a Long Term Evolution (LTE) systems or LTE-Advanced (LTE-A) systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform-spread-OFDM (DFT-S-OFDM). A wireless multiple-access communications system may include a number of base stations or network access nodes, each simultaneously supporting communication for multiple communication devices, which may be otherwise known as user equipment (UE).

In some wireless systems, a base station may generate a codeword to transmit information to a UE. In some cases, the base station may transmit the codeword to the UE in a physical broadcast channel (PBCH). However, in some cases, the UE may not reliably decode the codeword based on a configuration or capabilities of the UE, or based on interference in the PBCH.

SUMMARY

The described techniques relate to improved methods, systems, devices, or apparatuses that support a self-decodable physical broadcast channel (PBCH) design for polar codes. Generally, the described techniques provide for encoding a codeword and mapping the encoded bits to a PBCH bandwidth in such a way to improve decoding reliability at a user equipment (UE). For example, a base station may identify a subset of the bandwidth allocated for PBCH transmission, and may assign respective sub-channels (e.g., polar channels) to a set of information bits based on the identified subset of the bandwidth. The base station may generate the codeword based on the channel assignments and a polar code, and may map the encoded bits so that the encoded bits corresponding to the respective sub-channels are transmitted within the identified subset of the PBCH bandwidth. A UE may receive the subset of encoded bits in the subset of the PBCH bandwidth—and, in some cases, may receive additional encoded bits of the codeword in other portions of the PBCH bandwidth—and may decode the codeword based on the received subset of encoded bits.

A method of wireless communication is described. The method may include identifying a plurality of information bits for encoding according to a polar code, the plurality of information bits associated with a PBCH transmission having a PBCH bandwidth, and determining a number of encoded bits to transmit within a first subset of the PBCH bandwidth corresponding to a second signal transmission temporally proximate to the PBCH transmission. The method may further include assigning respective sub-channels of the polar code to the plurality of information bits based at least in part on the determined number of encoded bits, generating a codeword based at least in part on the assigned respective sub-channels and the plurality of information bits, mapping a subset of encoded bits of the codeword to the first subset of the PBCH bandwidth, wherein the subset of the encoded bits of the codeword comprises encoded bits corresponding to the respective sub-channels, and transmitting at least the subset of the encoded bits of the codeword in the PBCH transmission.

An apparatus for wireless communication is described. The apparatus may include means for identifying a plurality of information bits for encoding according to a polar code, the plurality of information bits associated with a PBCH transmission having a PBCH bandwidth, and means for determining a number of encoded bits to transmit within a first subset of the PBCH bandwidth corresponding to a second signal transmission temporally proximate to the PBCH transmission. The apparatus may further include means for assigning respective sub-channels of the polar code to the plurality of information bits based at least in part on the determined number of encoded bits, means for generating a codeword based at least in part on the assigned respective sub-channels and the plurality of information bits, means for mapping a subset of encoded bits of the codeword to the first subset of the PBCH bandwidth, wherein the subset of the encoded bits of the codeword comprises encoded bits corresponding to the respective sub-channels, and means for transmitting at least the subset of the encoded bits of the codeword in the PBCH transmission.

Another apparatus for wireless communication is described. The apparatus may include a processor, memory in electronic communication with the processor, and instructions stored in the memory. The instructions may be operable to cause the processor to identify a plurality of information bits for encoding according to a polar code, the plurality of information bits associated with a PBCH transmission having a PBCH bandwidth, and determine a number of encoded bits to transmit within a first subset of the PBCH bandwidth corresponding to a second signal transmission temporally proximate to the PBCH transmission. The instructions may be further operable to cause the processor to assign respective sub-channels of the polar code to the plurality of information bits based at least in part on the determined number of encoded bits, generate a codeword based at least in part on the assigned respective sub-channels and the plurality of information bits, map a subset of encoded bits of the codeword to the first subset of the PBCH bandwidth, wherein the subset of the encoded bits of the codeword comprises encoded bits corresponding to the respective sub-channels, and transmit at least the subset of the encoded bits of the codeword in the PBCH transmission.

A non-transitory computer readable medium for wireless communication is described. The non-transitory computer-readable medium may include instructions operable to cause a processor to identify a plurality of information bits for encoding according to a polar code, the plurality of information bits associated with a PBCH transmission having a PBCH bandwidth, and determine a number of encoded bits to transmit within a first subset of the PBCH bandwidth corresponding to a second signal transmission temporally proximate to the PBCH transmission. The non-transitory computer-readable medium may further include instructions operable to cause the processor to assign respective sub-channels of the polar code to the plurality of information bits based at least in part on the determined number of encoded bits, generate a codeword based at least in part on the assigned respective sub-channels and the plurality of information bits, map a subset of encoded bits of the codeword to the first subset of the PBCH bandwidth, wherein the subset of the encoded bits of the codeword comprises encoded bits corresponding to the respective sub-channels, and transmit at least the subset of the encoded bits of the codeword in the PBCH transmission.

Some examples of the method, apparatus, and non-transitory computer-readable medium described above may further include processes, features, means, or instructions for mapping an initial subset of the encoded bits of the codeword to a second subset of the PBCH bandwidth, wherein the initial subset of the encoded bits of the codeword comprises encoded bits corresponding to an initial set of sub-channels.

In some examples of the method, apparatus, and non-transitory computer-readable medium described above, the determining the sub-channels of the polar code may further comprise determining the sub-channels of the polar code for the plurality of information bits based at least in part on a code length and a number of the plurality of information bits. Some examples of the method, apparatus, and non-transitory computer-readable medium described above may further include processes, features, means, or instructions for determining the sub-channels of the polar code for the plurality of information bits based at least in part on excluding the initial set of sub-channels.

Some examples of the method, apparatus, and non-transitory computer-readable medium described above may further include processes, features, means, or instructions for identifying a second subset of the PBCH bandwidth distinct from the first subset of the PBCH bandwidth. Some examples of the method, apparatus, and non-transitory computer-readable medium described above may further include processes, features, means, or instructions for determining a repeated subset of the encoded bits of the codeword for mapping to the second subset of the PBCH bandwidth for the PBCH transmission. Some examples of the method, apparatus, and non-transitory computer-readable medium described above may further include processes, features, means, or instructions for mapping the repeated subset of the encoded bits of the codeword to the second subset of the PBCH bandwidth.

In some examples of the method, apparatus, and non-transitory computer-readable medium described above, the mapping may further comprise mapping the subset of the encoded bits of the codeword to a first orthogonal frequency-division multiplexing (OFDM) symbol and a second OFDM symbol in a frequency-first, time-second order. In some examples of the method, apparatus, and non-transitory computer-readable medium described above, the first OFDM symbol and the second OFDM symbol may be separated in a time domain by resources assigned for the second signal transmission. In some examples of the method, apparatus, and non-transitory computer-readable medium described above, the second signal transmission comprises a synchronization signal transmission.

A method of wireless communication is described. The method may include identifying a first subset of a PBCH bandwidth for a PBCH transmission, the first subset of the PBCH bandwidth corresponding to a second signal transmission temporally proximate to the PBCH transmission, and receiving a subset of encoded bits of a codeword of the PBCH transmission over the first subset of the PBCH bandwidth, the codeword generated from a plurality of information bits according to a polar code, wherein the PBCH transmission comprises at least a second subset of the PBCH bandwidth that is distinct from the first subset of the PBCH bandwidth, and wherein an initial subset of the encoded bits of the codeword and a repeated subset of the encoded bits of the codeword are mapped to the second subset of the PBCH bandwidth. The method may further include performing a decoding process on the received subset of the encoded bits of the codeword to obtain the plurality of information bits, wherein respective sub-channels of the polar code assigned to the plurality of information bits are determined based at least in part on a number of encoded bits in the subset of encoded bits of the codeword.

An apparatus for wireless communication is described. The apparatus may include means for identifying a first subset of a PBCH bandwidth for a PBCH transmission, the first subset of the PBCH bandwidth corresponding to a second signal transmission temporally proximate to the PBCH transmission, and means for receiving a subset of encoded bits of a codeword of the PBCH transmission over the first subset of the PBCH bandwidth, the codeword generated from a plurality of information bits according to a polar code, wherein the PBCH transmission comprises at least a second subset of the PBCH bandwidth that is distinct from the first subset of the PBCH bandwidth, and wherein an initial subset of the encoded bits of the codeword and a repeated subset of the encoded bits of the codeword are mapped to the second subset of the PBCH bandwidth. The apparatus may further include means for performing a decoding process on the received subset of the encoded bits of the codeword to obtain the plurality of information bits, wherein respective sub-channels of the polar code assigned to the plurality of information bits are determined based at least in part on a number of encoded bits in the subset of encoded bits of the codeword.

Another apparatus for wireless communication is described. The apparatus may include a processor, memory in electronic communication with the processor, and instructions stored in the memory. The instructions may be operable to cause the processor to identify a first subset of a PBCH bandwidth for a PBCH transmission, the first subset of the PBCH bandwidth corresponding to a second signal transmission temporally proximate to the PBCH transmission, and receive a subset of encoded bits of a codeword of the PBCH transmission over the first subset of the PBCH bandwidth, the codeword generated from a plurality of information bits according to a polar code, wherein the PBCH transmission comprises at least a second subset of the PBCH bandwidth that is distinct from the first subset of the PBCH bandwidth, and wherein an initial subset of the encoded bits of the codeword and a repeated subset of the encoded bits of the codeword are mapped to the second subset of the PBCH bandwidth. The instructions may be further operable to cause the processor to perform a decoding process on the received subset of the encoded bits of the codeword to obtain the plurality of information bits, wherein respective sub-channels of the polar code assigned to the plurality of information bits are determined based at least in part on a number of encoded bits in the subset of encoded bits of the codeword.

A non-transitory computer readable medium for wireless communication is described. The non-transitory computer-readable medium may include instructions operable to cause a processor to identify a first subset of a PBCH bandwidth for a PBCH transmission, the first subset of the PBCH bandwidth corresponding to a second signal transmission temporally proximate to the PBCH transmission, and receive a subset of encoded bits of a codeword of the PBCH transmission over the first subset of the PBCH bandwidth, the codeword generated from a plurality of information bits according to a polar code, wherein the PBCH transmission comprises at least a second subset of the PBCH bandwidth that is distinct from the first subset of the PBCH bandwidth, and wherein an initial subset of the encoded bits of the codeword and a repeated subset of the encoded bits of the codeword are mapped to the second subset of the PBCH bandwidth. The non-transitory computer-readable medium may further include instructions operable to cause the processor to perform a decoding process on the received subset of the encoded bits of the codeword to obtain the plurality of information bits, wherein respective sub-channels of the polar code assigned to the plurality of information bits are determined based at least in part on a number of encoded bits in the subset of encoded bits of the codeword.

Some examples of the method, apparatus, and non-transitory computer-readable medium described above may further include processes, features, means, or instructions for identifying that a signal-to-noise ratio (SNR) of the PBCH transmission over the first subset of the PBCH bandwidth may be below a threshold. Some examples of the method, apparatus, and non-transitory computer-readable medium described above may further include processes, features, means, or instructions for performing the decoding process on the received subset of the encoded bits of the codeword, the initial subset of the encoded bits of the codeword, and the repeated subset of the encoded bits of the codeword mapped to the second subset of the PBCH bandwidth to obtain the plurality of information bits.

Some examples of the method, apparatus, and non-transitory computer-readable medium described above may further include processes, features, means, or instructions for determining a failure of the decoding process. Some examples of the method, apparatus, and non-transitory computer-readable medium described above may further include processes, features, means, or instructions for performing a second decoding process on the received subset of the encoded bits of the codeword, the initial subset of the encoded bits of the codeword, and the repeated subset of the encoded bits of the codeword mapped to the second subset of the PBCH bandwidth to obtain the plurality of information bits.

In some examples of the method, apparatus, and non-transitory computer-readable medium described above, the receiving may further comprise receiving the subset of the encoded bits of the codeword from a first OFDM symbol and a second OFDM symbol in a frequency-first, time-second order. In some examples of the method, apparatus, and non-transitory computer-readable medium described above, the second signal transmission comprises a synchronization signal transmission.

DETAILED DESCRIPTION

Figure 1:
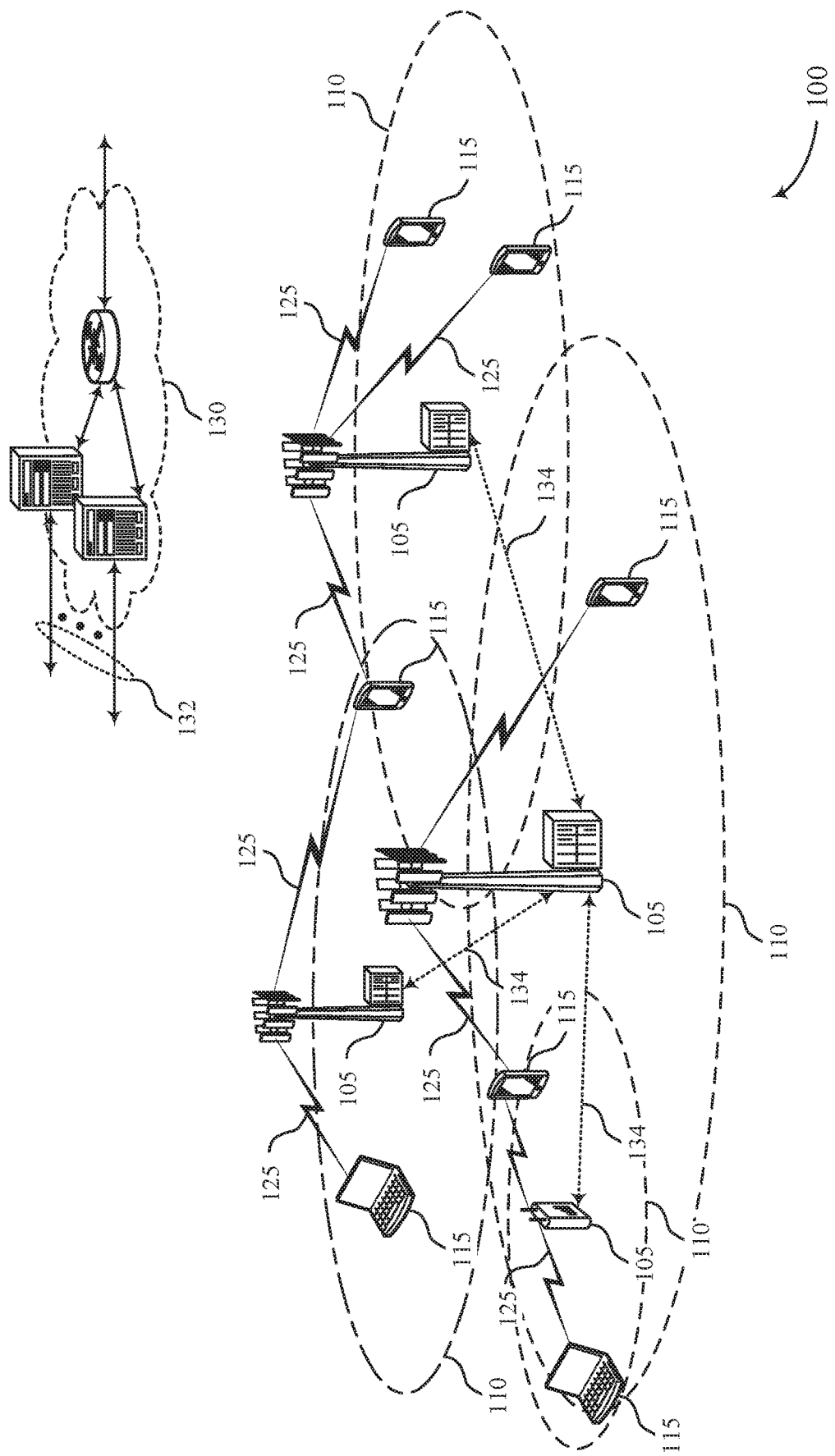
FIG. 1 illustrates an example of a system for wireless communication in accordance with aspects of the present disclosure.

In some wireless systems (e.g., new radio (NR) systems), a base station may communicate information to user equipment (UEs) over a physical broadcast channel (PBCH). In order to generate a codeword for transmission for the PBCH, the base station may utilize polar coding techniques. Polar coding may involve assigning bits to different sub-channels, and encoding the bits such that certain sub-channels (e.g., polar channels) are polarized for increased reliability, while other sub-channels that are polarized decrease in reliability. The base station may assign the sub-channels in such a way to transmit information bits in the reliable sub-channels, and transmit frozen bits (e.g., bits with a known default value) to the rest of the sub-channels. In some cases, the base station may additionally utilize error checking codes (e.g., cyclic redundancy check (CRC) codes, etc.), interlacing, or repetition techniques for improved reliability or security of the codeword, or may implement some combination of these techniques.

The base station may perform resource mapping of the codeword in a bandwidth allocated for PBCH transmission to improve reception of the codeword. For example, in some cases, a UE receiving the codeword may monitor a narrower bandwidth than the full bandwidth allocated for PBCH transmission. In other cases, the UE may perform channel estimation for a narrower bandwidth than the PBCH bandwidth, or may determine that channel estimation for a narrower bandwidth is more reliable. In any of these cases, the base station may select to transmit certain encoded bits of the codeword within the narrower portion of the PBCH bandwidth, and may transmit the other encoded bits of the codeword in the rest of the PBCH bandwidth. In some cases, the narrower bandwidth may correspond to a bandwidth for some other signal, such as a synchronization signal.

The base station may select specific encoded bits for transmission within this narrower bandwidth so that the UE may determine the information bits by decoding these specific encoded bits, even if the UE does not decode the remaining encoded bits. For example, the base station may select the encoded bits corresponding to a set of sub-channels that include the sub-channels assigned to the information bits of the codeword, and may map the selected bits to the narrower bandwidth. The base station may additionally map encoded bits corresponding to pre-frozen sub-channels or encoded bits corresponding to repetition or redundancy bits to other portions of the PBCH bandwidth.

The UE may either perform a decoding process on the encoded bits received in the subset of the PBCH bandwidth, or may perform the decoding process on any encoded bits received within the full PBCH bandwidth (e.g., if the PBCH has a signal-to-noise ratio (SNR) below some threshold, or if an initial decoding based on the subset of encoded bits failed).

Aspects of the disclosure are initially described in the context of a wireless communications system. Further aspects are discussed with respect to one or more devices, communication systems, signaling designs, and process flows. Additionally, aspects of the disclosure are illustrated by and described with reference to apparatus diagrams, system diagrams, and flowcharts that relate to a self-decodable PBCH design for polar codes.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, or a NR network. In some cases, wireless communications system 100 may support enhanced broadband communications, ultra-reliable (e.g., mission critical) communications, low latency communications, or communications with low-cost and low-complexity devices. In some cases, a base station 105 may support encoding of codewords with a self-decodable design, and may transmit encoded bits of the codeword in the PBCH. A UE 115 may receive either a subset of all of the encoded bits of the codeword, and may determine the transmitted information based on the self-decodable design.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions, from a base station 105 to a UE 115. Downlink transmissions may also be called forward link transmissions while uplink transmissions may also be called reverse link transmissions.

The geographic coverage area 110 for a base station 105 may be divided into sectors making up only a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1 or other interface). Base stations 105 may communicate with one another over backhaul links 134 (e.g., via an X2 or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 MHz to 300 GHz. Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that can tolerate interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a CA configuration in conjunction with CCs operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving devices are equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105. Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a highest signal strength, highest SNR, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical (PHY) layer, transport channels may be mapped to physical channels.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an E-UTRA absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as OFDM or DFT-s-OFDM).

The organizational structure of the carriers may be different for different radio access technologies (e.g., LTE, LTE-A, NR, etc.). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs that can support simultaneous communications via carriers associated with more than one different carrier bandwidth.

Wireless communications system 100 may support communication with a UE 115 on multiple cells or carriers, a feature which may be referred to as carrier aggregation (CA) or multi-carrier operation. A UE 115 may be configured with multiple downlink CCs and one or more uplink CCs according to a carrier aggregation configuration. Carrier aggregation may be used with both FDD and TDD component carriers.

Wireless communications systems such as an NR system may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

In some wireless systems (e.g., NR systems) a base station 105 may communicate on the downlink with a UE 115 over a PBCH. In some cases, the base station 105 may utilize polar coding techniques to generate a codeword for transmission. The base station 105 may perform resource mapping of the codeword in the bandwidth allocated for PBCH transmission to improve reception of the codeword. For example, in some cases, a UE 115 receiving the codeword may monitor a narrower bandwidth than the full bandwidth allocated for PBCH transmission. In other cases, the UE 115 may perform channel estimation for a narrower bandwidth than the PBCH bandwidth, or may determine that channel estimation for a narrower bandwidth is more reliable. In any of these cases, the base station 105 may select to transmit certain encoded bits of the codeword within the narrower portion of the PBCH bandwidth, and may transmit the other encoded bits of the codeword in the rest of the PBCH bandwidth. The base station 105 may transmit the encoded bits corresponding to a set of sub-channels (e.g., polar channels) that include the sub-channels assigned to the information bits of the codeword within this narrower, more reliable bandwidth (e.g., sub-channels corresponding to the narrower bandwidth). In this way, the UE 115 may improve reception of the codeword, while reducing the frequencies it monitors.

Figure 2:
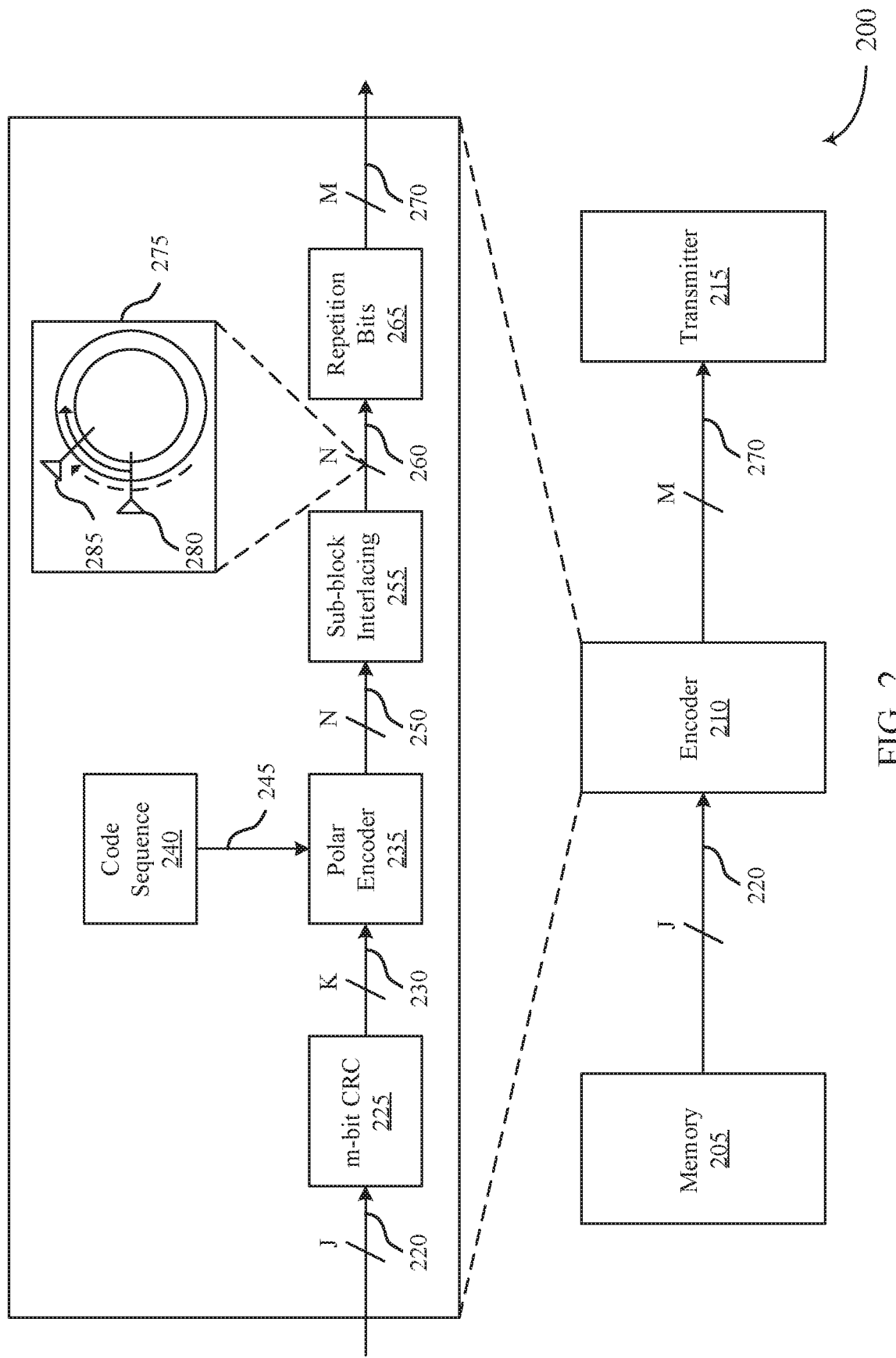
FIG. 2 illustrates an example of a device in accordance with aspects of the present disclosure.

FIG. 2 illustrates an example of a device 200 that supports a self-decodable PBCH design for polar codes in accordance with various aspects of the present disclosure. The device 200 may be a device within a wireless communication system 100 that performs an encoding process for transmission in a PBCH, such as a base station 105 as described with respect to FIG. 1. In some cases, a similar device may be implemented for decoding as well, for example, by a UE 115, as described with respect to FIG. 1. The device 200 may include a memory 205, encoder 210, and transmitter 215 in communication with each other. In some cases, a similar process may be implemented by a UE 115 encoding a codeword to transmit to a base station 105.

As shown, device 200 includes a memory 205, an encoder 210, and a transmitter 215. Bus 220 may connect memory 205 to encoder 210 and bus 270 may connect encoder 210 to transmitter 215. In some instances, device 200 may have data stored in memory 205 to be transmitted to another device, such as a UE 115. To initiate the transmission process, the device 200 may retrieve from memory 205 data (e.g., in the form of an input vector) for transmission. The data may include a number of information bits provided from memory 205 to encoder 210 via bus 220. The number of information bits may be represented as a value as shown. The encoder 210 may encode the number of information bits and output a codeword having a length which may be different than or the same as J.

In some cases, the encoder 210 may be an example of a polar encoder. The encoder 210 may include multiple steps or components, for example a CRC component 225, a polar encoder 235, a code sequence 240, a sub-block interlacing component 255, a repetition bit component 265, or some combination of these components. Encoder 210 may receive J information bits from memory 205 (e.g., via bus 220), and may input the information bits into the CRC component 225. The CRC component 225 may generate 'm' parity or CRC bits based on the information bits. For example, the CRC component 225 may utilize a CRC polynomial to determine the set of CRC bits. The CRC component 225 may then aggregate the J information bits with the m CRC bits to form a bit string or vector having 'K' bits, which may be referred to as a set of payload bits. In some cases, a length of K may be equal to the length of J plus the length of m. The K payload bits may be sent to the polar encoder 235 via bus 230.

The polar encoder 235 may receive the K payload bits, and may assign the bits to sub-channels (e.g., polar channels). In some cases, the polar encoder 235 may assign the bits to the sub-channels based on reliability metrics of the sub-channels. For example, the polar encoder 235 may be configured to generate codewords of a certain length 'N'. The polar encoder 235 may identify or lookup reliability metrics for N sub-channels, and assign the payload bits to the K most reliable sub-channels. In some cases, a code sequence 240 may also be input into the polar encoder 235 (e.g., at 245) to indicate the reliability metrics of the sub-channels. The assigned sub-channels may determine the bit indices for the payload bits. In some cases, the polar encoder 235 may pre-freeze a number of sub-channels prior to generating the codeword. For example, the polar encoder 235 may select an initial set of sub-channels, and may assign frozen bits to each of the selected set of sub-channels, regardless of the reliability metrics. The polar encoder 235 may then assign the payload bits to the remaining K most reliable sub-channels available following the pre-freezing. A decoder receiving the codeword may include an indication of the pre-frozen initial set of sub-channels. Once the payload bits are assigned to sub-channels, the polar encoder 235 may assign frozen bits to the remaining sub-channels, and may perform a polar encoding process based on the assigned sub-channels and the payload bits to generate an N-bit codeword. For example, the polar encoder 235 may exclude the initial set of sub-channels (e.g., exclude the initial set of polar channels which may have been pre-frozen from the polar encoding process).

The polar encoder 235 may send the N-bit codeword to the sub-block interlacing component 255 (e.g., via bus 250). The sub-block interlacing component 255 may divide the bits of the codeword into a number of sub-blocks of equal or varying size. For example, the sub-block interlacing component 255 may divide a 512-bit codeword into 32 sub-blocks of 16 bits each. The sub-block interlacing component 255 may then rearrange the sub-blocks, and construct a new codeword based on an interlacing pattern. A decoder receiving the codeword may include an indication of the interlacing pattern or a set of possible interlacing patterns, so that the decoder may rearrange the received interlaced codeword in order to determine the correct order of bits for the originally-generated codeword.

Following interlacing, the sub-block interlacing component 255 may send the codeword—which may still be N bits, following the interlacing—to the repetition bit component 265 (e.g., via bus 260). The repetition bit component 265 may generate a set of repeated or redundant bits based on the codeword. For example, if encoder 210 is configured to transmit a codeword of length 'M', the repetition bit component 265 may attach M-N redundant bits to the codeword (e.g., at the end of the codeword). These repetition bits may simply repeat bits from the codeword, or may be forms of parity or CRC bits based on the N codeword bits. In some cases, the repetition bit component 265 may receive the N-bit codeword in an N-bit circular buffer 275. The repetition bit component 265 may determine the redundant bits to attach to the N-bit codeword based on a start point 280 and end point 285 of reading from the circular buffer 275. The repetition bit component 265 or the encoder 210 may send the M-bit codeword (e.g., the N-bit codeword with M-N redundant bits attached) to the transmitter 215 via bus 270 for transmission.

Transmitter 215 may determine to transmit the M-bit codeword in a PBCH transmission. In order to support self-decoding of the information bits at a decoder within a truncated bandwidth, the transmitter 215 may transmit a subset of the bits within the truncated bandwidth of the PBCH bandwidth. The subset of bits of the codeword may correspond to the sub-channels assigned to the payload bits. The transmitter 215 may transmit other bits (e.g., the bits corresponding to the pre-frozen or excluded sub-channels, the redundant bits, or both) to other portions of the PBCH bandwidth. In some cases, the transmitter 215 may select the truncated bandwidth based on a bandwidth for one or more other signals. A receiving device (e.g., a UE 115) may receive the encoded bits in the truncated bandwidth, and in some cases may decode those bits—and thus, determine the payload bits—without receiving or decoding the other encoded bits (e.g., the pre-frozen or redundant bits) in the remainder of the PBCH bandwidth.

Figure 3:
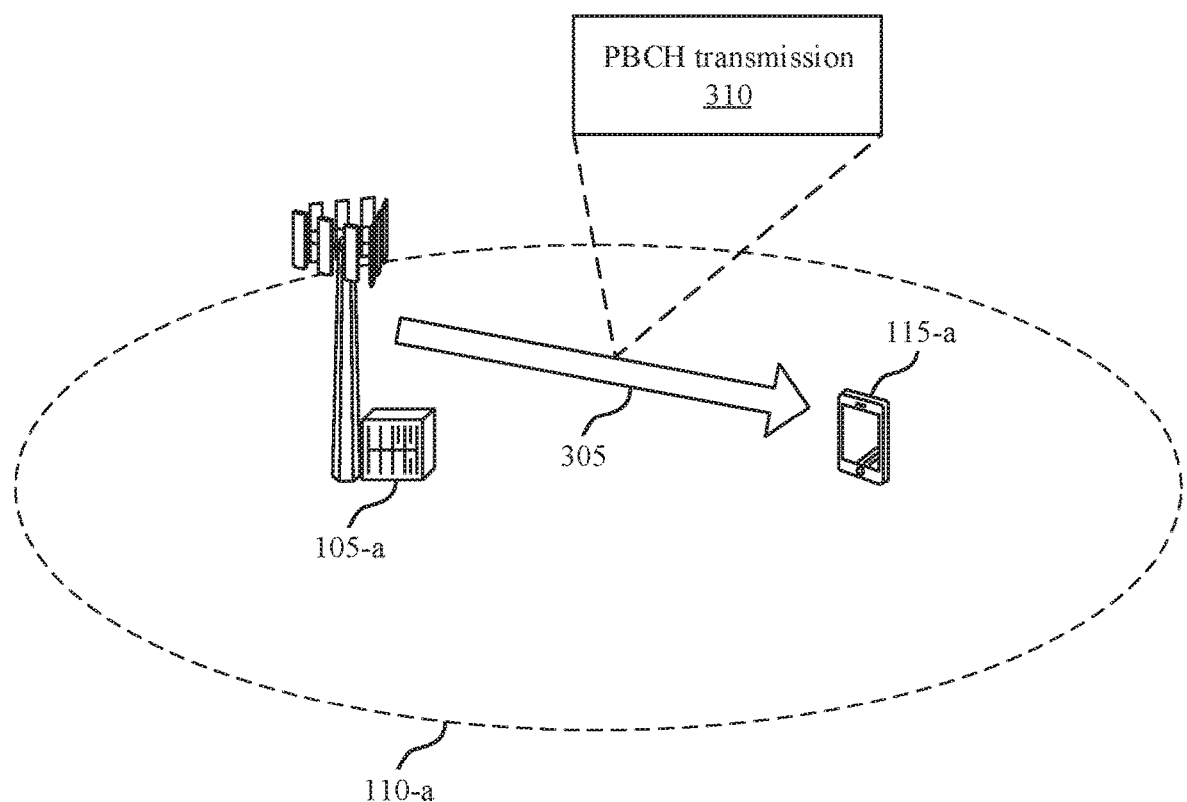
FIG. 3 illustrates an example of a wireless communication system in accordance with aspects of the present disclosure.

FIG. 3 illustrates an example of a wireless communication system 300 that supports a self-decodable PBCH design for polar codes in accordance with various aspects of the present disclosure. The wireless communication system 300 may include base station 105-a and UE 115-a, which may be examples of the corresponding devices described with respect to FIG. 1. In some cases, base station 105-a may be an example of a device 200 as described above, for example, with respect to FIG. 2. Base station 105-a may provide coverage for geographic coverage area 110-a, and may communicate with UE 115-a on the downlink over communication link 305. In some cases, base station 105-a may transmit one or more PBCH transmissions 310 within a bandwidth allocated for PBCH transmissions.

As described above, base station 105-a may generate a codeword based on a set of information bits and a polar code. Base station 105-a may transmit the codeword in the PBCH transmission to UE 115-a. In some wireless systems, a base station 105 may transmit the encoded bits for the codeword over the entire allocated PBCH bandwidth (e.g., for frequency diversity, a shortened transmission time, etc.). However, in these cases, a UE 115 may need to receive encoded bits across the entire bandwidth in order to decode the codeword and determine the information bits. However, in cases where the PBCH bandwidth is wider than bandwidths for some synchronization signals, the UE 115 may be configured to receive in a narrower bandwidth, or may have better channel estimation for a narrower bandwidth. For example, UE 115-a may perform a cell search process in which the UE 115-a tunes to a bandwidth of a synchronization signal, and thus is configured to receive the PBCH within the same bandwidth as the synchronization signal. Rather than transmitting the encoded bits corresponding to sub-channels such as sub-channels that may be mapped to information bits across the entire PBCH bandwidth, base station 105-a may map these encoded bits to a subset of the PBCH bandwidth, and in some cases may transmit encoded bits corresponding to sub-channels having frozen bits or redundant bits in the remaining sub-carriers of the PBCH bandwidth.

UE 115-a may receive the PBCH transmission 310, and may decode the codeword or a portion of the codeword based on receiving the encoded bits within the subset of the PBCH bandwidth. In some cases, UE 115-a may detect an SNR for the PBCH below a certain pre-determined or dynamic threshold. Based on the low SNR, UE 115-a may determine to decode the codeword based on bits received over the entire PBCH bandwidth. In some cases, decoding based on these additional bits may increase reliability of decoding, as the additional bits may include redundancy or other checks for the other encoded bits. For example, UE 115-a may decode a received subset of the encoded bits of the codeword, an initial subset of the encoded bits of the codeword, and a repeated subset of the encoded bits of the codeword mapped to the second subset of the PBCH bandwidth to obtain the plurality of information bits.

Additionally or alternatively, if UE 115-a attempts to decode the codeword or a portion of the codeword based on the encoded bits received in the subset of the PBCH bandwidth, and determines that the decoding process fails, UE 115-a may repeat the decoding process utilizing the encoded bits received over the remainder of the PBCH bandwidth in addition to the encoded bits received in the subset of the bandwidth. For example, UE 115-a may perform a second decoding process on the received subset of the encoded bits of the codeword, the initial subset of the encoded bits of the codeword, and the repeated subset of the encoded bits of the codeword. In this way, supporting self-decoding in the subset of the PBCH bandwidth in a PBCH transmission 310 may not reduce the decoding reliability, as UE 115-a may still decode based on the entire allocated PBCH bandwidth if necessary or selected.

Figure 4:
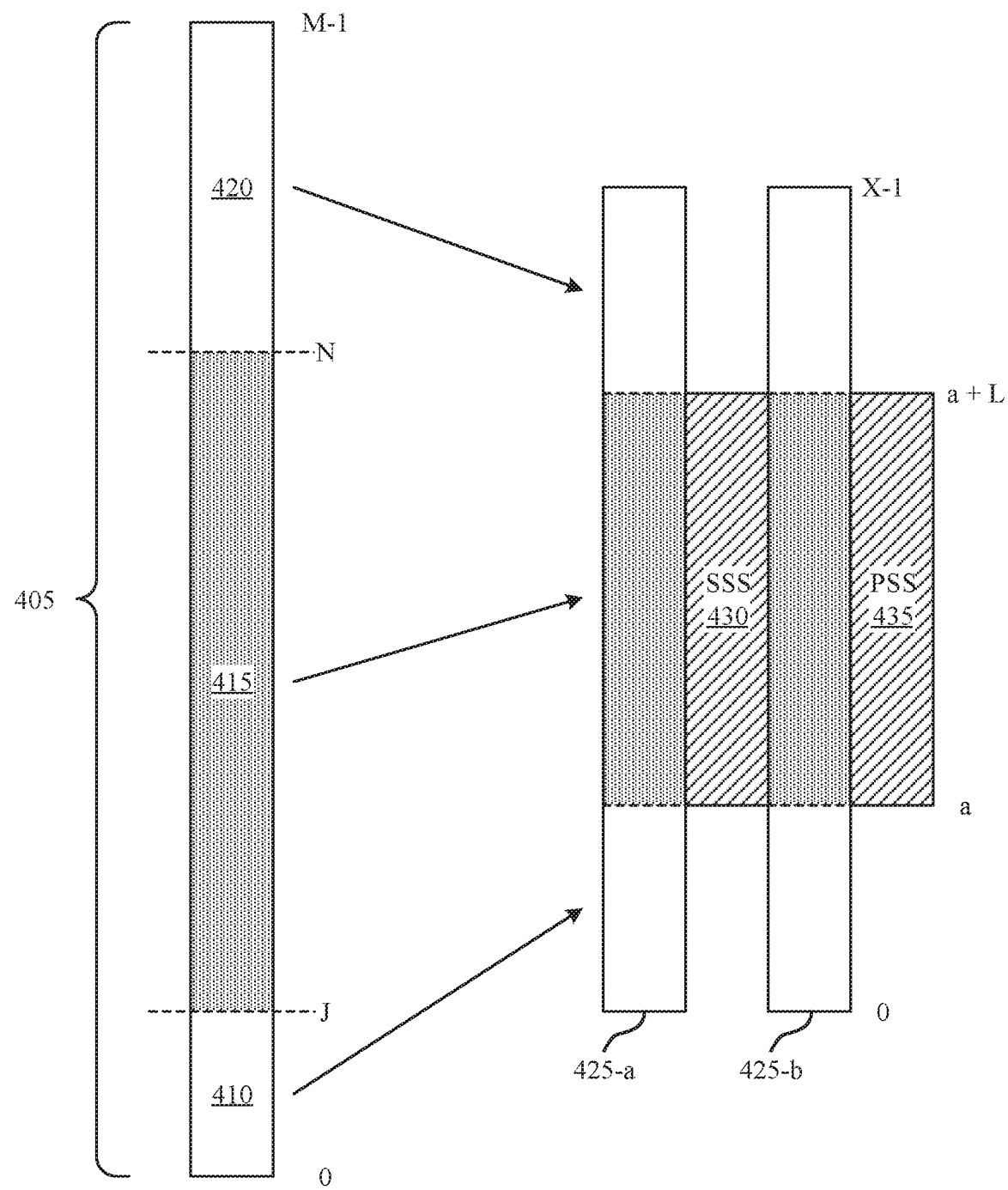
FIG. 4 illustrates an example of PBCH signaling in accordance with aspects of the present disclosure.

FIG. 4 illustrates an example of PBCH signaling 400 that supports a self-decodable PBCH design for polar codes in accordance with various aspects of the present disclosure. The PBCH signaling 400 may include transmitting a codeword 405 in a PBCH. In some cases, a first bandwidth may be allocated for PBCH or NR-PBCH transmission (e.g., the bandwidth defined from 0 to X−1 in FIG. 4) and a second bandwidth may be allocated for synchronization signal transmission (e.g., the bandwidth defined from a to a+L−1 in FIG. 4). A device, such as a base station 105 or a device 200 as described with respect to FIGS. 1 through 3, may map different portions or subsets of the codeword 405 to different portions or subsets of the orthogonal frequency-division multiplexing (OFDM) symbols 425 to improve reception and successful decoding of a portion 415 of the codeword 405.

In some systems, a base station may transmit the entire codeword across the full PBCH bandwidth of X subcarriers, without regard to where the sub-channels (e.g., polar channels) having information bits mapped to them are transmitted relative to the synchronization signal bandwidth. However, in such systems, a UE receiving the codeword may have to receive encoded bits across the full PBCH bandwidth in both OFDM symbols 425-a and 425-b. In some cases, these OFDM symbols 425 may additionally include sub-carriers (e.g., approximately a quarter of the total sub-carriers for the PBCH bandwidth) assigned for transmission of demodulation reference signals (DMRS). However, in many cases, the UE may be configured to receive most reliably within a portion of the bandwidth, for example, the portion of the bandwidth assigned for synchronization signal reception. For example, the UE may receive a secondary synchronization signal (SSS) 430 in a bandwidth from a to L, and similarly may receive a primary synchronization signal (PSS) 435 in a same or similar bandwidth. These signals may be used for channel estimation or coherent detection of the PBCH. Mapping sub-channels of the codeword 435 corresponding to all information bits of the PBCH within this bandwidth from a to a+L−1 may increase reliability of the transmission, and the UE may increase its successful decoding rate when decoding using received PBCH symbols over the truncated bandwidth.

The base station may generate the codeword 405 and map the encoded bits to resources specifically to support transmitting self-decodable bits within the subset of the PBCH bandwidth from a to a+L−1. Self-decodable bits may refer to a set of encoded bits that may be decoded independently of any other encoded bits. Accordingly, the base station may generate the codeword 405 such that the portion 415 mapped to the subset of the PBCH bandwidth includes encoded bits that may be decoded on their own, or may be decoded (e.g., with a higher reliability) along with other portions of the codeword 405, such as a portion containing pre-frozen encoded bits 410 or a portion containing repetition or redundancy bits 420.

The base station may identify a number of bits from J to N, and may pre-freeze unfrozen bits from 0 to J−1 before encoding the codeword 405. That is, the base station may not assign any information bits to sub-channels from 0 to J−1, as the corresponding encoded bits for these sub-channels may not be transmitted in the subset of the PBCH bandwidth (e.g., the base station may exclude any information bits to sub-channels from 0 to J−1). The base station may pre-freeze (e.g., assign frozen bits to) this initial subset of sub-channels, regardless of the reliability metrics for these sub-channels. Instead, the base station may assign each of the information bits to sub-channels corresponding to the encoded bits in the portion 415 from J to N−1. For example, the base station may assign the information bits to the sub-channels or bit channels within the portion 415 with the highest reliability metrics, and then may perform a polar encoding process based on the assigned sub-channels from 0 to N−1 to obtain a codeword having N encoded bits. In some cases, the base station may attach additional repetition or redundancy bits 420 to the resulting codeword to generate the full rate-matched codeword 405 having M encoded bits.

The base station may then map the different portions of the rate-matched codeword 405 to different portions of the PBCH bandwidth in order to support self-decoding for encoded bits transmitted within the subset of the bandwidth from a to a+L−1. For example, the base station may transmit the encoded bits from 0 to J−1 in the bandwidth from 0 to a (e.g., in both OFDM symbols 425-a and 425-b, in a frequency-first, time-second manner). The base station may transmit the encoded bits from J to N−1 in the subset of the PBCH bandwidth from a to a+L−1, and may transmit the encoded bits from N to M−1 in the bandwidth from a+L to X−1 (e.g., similarly in both OFDM symbols 425, frequency-first and time-second). That is, a first encoded bit(s) may be transmitted at a first frequency value and a first time value, and a second encoded bit(s) may be transmitted at a second frequency value and the first time value. The base station may map encoded bits to a second time value once all of the frequency values within the allocated bandwidth are mapped with encoded bits. Although illustrated as codeword bits corresponding to sub-channels 0 to J−1 being mapped to the PBCH in portion 415, in some cases less than 0 to J−1 may be mapped. For example, bits G to J−1 may be included within portion 415, where sub-channels from 0 to J−1 are pre-frozen, and bits 0 to G−1 are punctured. The punctured bits may be inserted as part of repetition bits 420, for example. In other examples, a number of bits that can be mapped to subcarriers 0 to a−1 may exceed J. In these instances, portions of the repetition bits 420 may be mapped to a portion of (e.g., a bottom portion) subcarriers 0 to a−1.

In specific examples, the base station may generate encoded bits from 0 to 127 as pre-frozen bits, encoded bits from 128 to 511 as the self-decodable bits, and bits 512 to 863 as redundant bits. The base station may use QPSK modulation for the PBCH (e.g., mapping two bits per resource element) and every fourth subcarrier of the PBCH may be used for DMRS. The base station may map and transmit the pre-frozen encoded bits 410 in OFDM symbols 425-a and 425-b in a bandwidth spanning sub-carriers 0 to 8 (e.g., with puncturing of 100 of the J=128 bits). The base station may further map and transmit the self-decodable bits 415 in OFDM symbols 425-a and 425-b in a bandwidth spanning sub-carriers 9 to 136, and the redundant bits 420 in OFDM symbols 425-a and 425-b in a bandwidth spanning sub-carriers 137 to 253. In this example, M=864, J=128, N=512, a=9, L=128, and X=254. In some examples, the bits punctured from the J=128 bits may be included in the same portion of the PBCH as redundant bits 420, and thus X=288.

A UE receiving the encoded bits may receive the self-decodable bits in the subset of the PBCH bandwidth from a to a+L−1, and may self-decode these encoded bits as a 384 bit puncture from a 512 bit polar coded codeword, where the 384 bit self-decodable section contains the same number of information bits as the 512 bit polar coded codeword. In some examples, the portion of the PBCH extending below the PSS and SSS may be the same size as the portion extending above the PBCH. In some cases, this may mean that the number of bits that can be mapped to subcarriers 0 to a−1 may exceed J. In this instance, portions of the repetition bits 420 may be wrapped to the portion extending below the PSS and SSS. For example, in the case where M=864, J=128, a=80, L=128, and X=288, portions of the M−N=352 repetition bits may be wrapped and mapped to subcarriers 0 to 36 of the PBCH for OFDM symbols 425-a and 425-b, while the 0-J−1 bits are mapped to subcarriers 37 to 79 of the PBCH. In yet another example, M=864, J=128, a=43, L=96, and X=251. In this example, no puncturing may be performed in the pre-frozen encoded bits 410 mapped to subcarriers 0 to a−1.

The UE may therefore determine the information bits transmitted by the base station by monitoring the same bandwidth that is allocated for other signals temporally proximate to the PBCH transmissions. For example, the other signals (e.g., the synchronization signals) may be transmitted contiguously in the time domain, or may be transmitted within a certain time threshold from the OFDM symbols 425 allocated for PBCH transmission. In some cases, the base station may perform soft-combining of multiple transmissions within the subset of the PBCH bandwidth.

In some cases, the UE receiving the encoded bits may process and decode additional portions or the entire codeword 405. For example, the UE may detect or receive an indication of an SNR lower than a threshold SNR. Based on the poor channel quality, the UE may determine to decode using additional encoded bits to improve reliability of the decoding process. In another example, the UE may fail to decode the self-decodable bits, and may perform a second decoding process using additional encoded bits to improve the reliability of the decoding process. In these cases, the UE may utilize the pre-frozen bits, the redundant bits, or both that may be received in the remaining portions of the PBCH bandwidth (e.g., from 0 to a−1, and from a+L to X−1). For example, the UE may decode a received subset of encoded bits of the codeword 405, an initial subset of the encoded bits of the codeword 405, and a repeated subset of the encoded bits of the codeword 405. Decoding based on the full set of encoded bits for codeword 405 may achieve a same reliability as if the codeword 405 was simply transmitted over the full PBCH bandwidth for the OFDM symbol 425 without any specific mapping for self-decodable portions. In this way, the self-decodable PBCH design may not reduce reliability of decoding in poor channel conditions, while improving reliability and reducing the bandwidth to monitor in other channel conditions.

Figure 5:
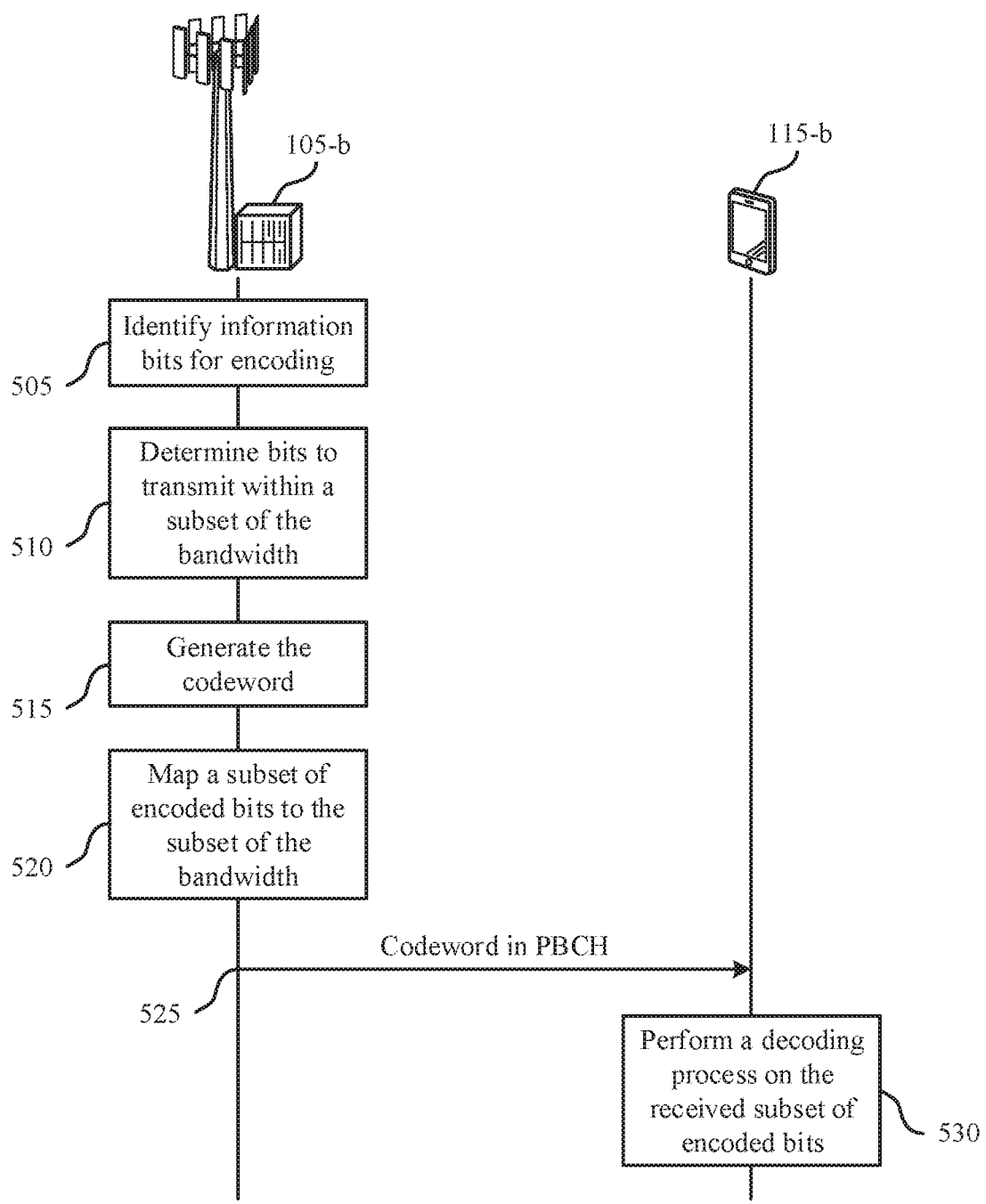
FIG. 5 illustrates an example of a process flow in accordance with aspects of the present disclosure.

FIG. 5 illustrates an example of a process flow 500 that supports a self-decodable PBCH design for polar codes in accordance with various aspects of the present disclosure. The process flow 500 may include base station 105-b and UE 115-b, which may be examples of a base station 105 and a UE 115 as described with respect to FIGS. 1 and 3. As illustrated, the process flow 500 describes base station 105-b performing an encoding process and UE 115-b performing a decoding process, as the codeword is described as transmitted over a PBCH. However, in some cases, UE 115-b may encode a codeword, and transmit the codeword to base station 105-b in another channel. Accordingly, in some cases, both a base station 105 and a UE 115 may perform either the encoding aspects described below with respect to base station 105-b or the decoding aspects described below with respect to UE 115-b.

At 505, base station 105-b may identify a set of information bits for encoding using a polar code. The set of information bits may be associated with a PBCH transmission having a PBCH bandwidth.

At 510, base station 105-b may determine a number of encoded bits to transmit within a first subset of the PBCH bandwidth corresponding to a second signal transmission temporally proximate to the PBCH transmission. For example, the first subset of the PBCH bandwidth may be a truncated PBCH bandwidth. The second signal transmission may be an example of a synchronization signal transmission, such as a PSS or an SSS.

At 515, base station 105-b may assign respective sub-channels of the polar code to the set of information bits based on the determined number of encoded bits. In some examples, base station 105-b may assign the sub-channels of the polar code to the set of information bits based on a code length and a number of information bits. In some cases, base station 105-b may assign the sub-channels of the polar code to the set of information bits based on excluding an initial set of sub-channels. In some other cases, base station 105-b may determine a preliminary subset of sub-channels (e.g., polar channels) of the polar code corresponding to information bit locations based on the code length and the number of bits in the set of information bits, and may re-assign the preliminary subset of sub-channels to be frozen bit locations. Base station 105-b may generate a codeword based on the assigned sub-channels and the set of information bits.

At 520, base station 105-b may map a subset of encoded bits of the codeword to the first subset of the PBCH bandwidth. The subset of encoded bits may include the encoded bits that correspond to the respective sub-channels. In some cases, base station 105-b may additionally map an initial subset of the encoded bits of the codeword (e.g., corresponding to an initial set of sub-channels) to a second subset of the PBCH bandwidth. In some cases, base station 105-*b* may map a repeated subset of encoded bits of the codeword to the second subset of the PBCH bandwidth, or to a third subset of the PBCH bandwidth. The mapping may include mapping encoded bits to two separate OFDM symbols in a frequency-first, time-second order. The OFDM symbols may be separated in the time domain by resources assigned for the second signal transmission (e.g., an SSS transmission). In some cases, the bandwidth assigned for the SSS transmission may be equal to the first subset of the PBCH bandwidth.

At 525, base station 105-*b* may transmit at least the subset of the encoded bits of the codeword to UE 115-*b*. In some cases, base station 105-*b* may transmit the entire codeword to UE 115-*b*. UE 115-*b* may receive the subset of encoded bits over the first subset of the PBCH bandwidth, or may receive the entire codeword over the full PBCH bandwidth. In some cases, UE 115-*b* may receive an initial subset of encoded bits of the codeword in a distinct second subset of the PBCH bandwidth. In some examples, UE 115-*b* may receive a repeated subset of encoded bits of the codeword in the distinct second subset of the PBCH bandwidth. UE 115-*b* may receive a first portion of the encoded bits in a first OFDM symbol, and may receive a second portion of the encoded bits in a second OFDM symbol, in a frequency-first, time-second order.

At 530, UE 115-*b* may perform a decoding process on the received subset of encoded bits of the codeword. UE 115-*b* may obtain the set of information bits based on the decoding process, as the respective sub-channels of the polar code assigned to the set of information bits may be determined based on decoding the subset of encoded bits. In some cases, UE 115-*b* may perform the decoding process additionally based on the initial subset of encoded bits. In some cases, UE 115-*b* may perform the decoding process further based on a third subset of encoded bits corresponding to sub-channels (e.g., bit channels or polar channels) assigned to the redundant bits. In some cases, if an initial decoding of the subset of the encoded bits fails, UE 115-*b* may repeat the decoding process, but this time may decode the codeword based on the entire set of received encoded bits.

Figure 6:
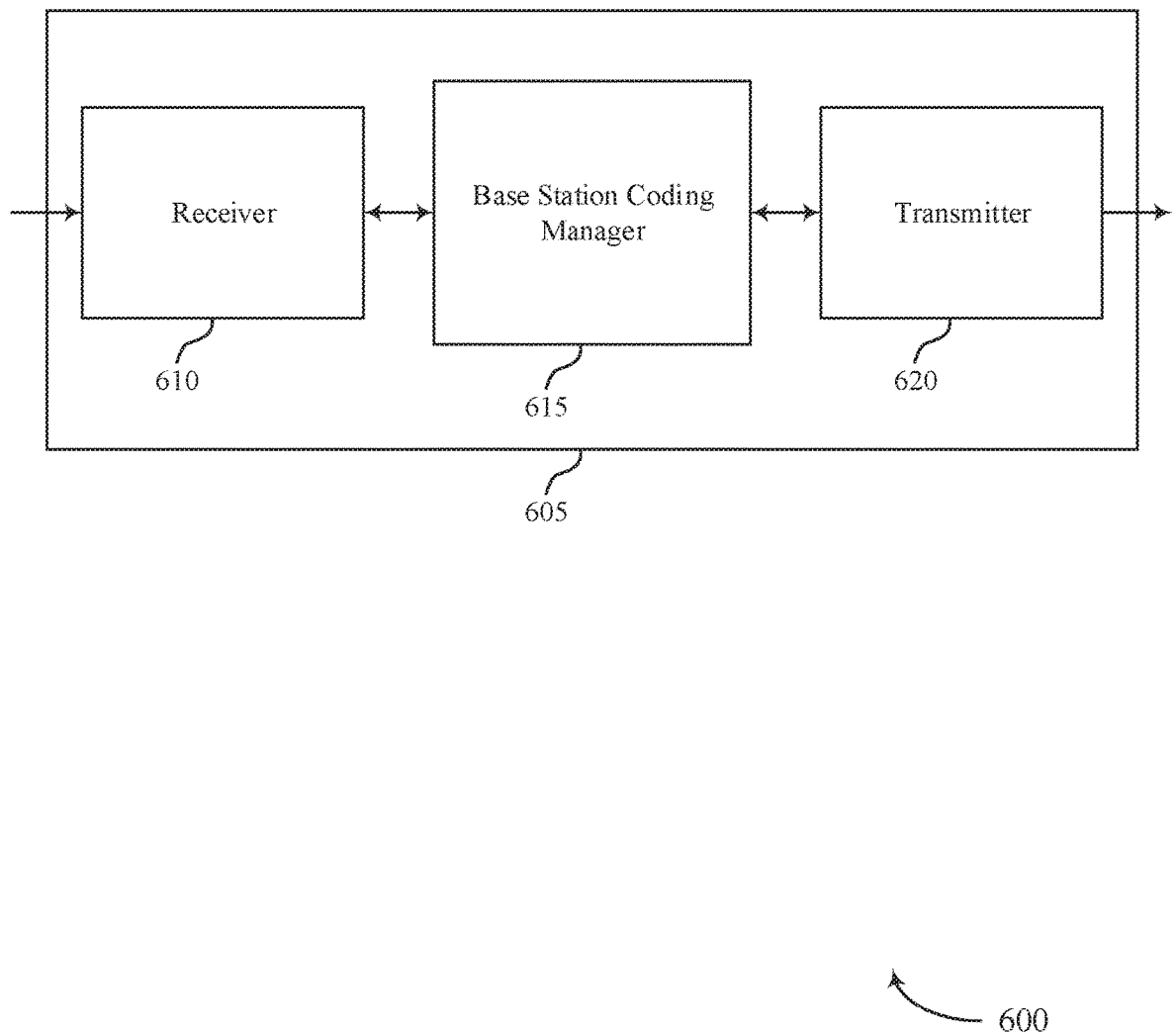
FIGS. 6 through 8 show block diagrams of a device in accordance with aspects of the present disclosure.

FIG. 6 shows a block diagram 600 of a wireless device 605 that supports a self-decodable PBCH design for polar codes in accordance with aspects of the present disclosure. Wireless device 605 may be an example of aspects of a base station 105 as described herein. Wireless device 605 may include receiver 610, base station coding manager 615, and transmitter 620. Wireless device 605 may also include a processor. Each of these components may be in communication with one another (e.g., via one or more buses).

Receiver 610 may receive information such as packets, user data, or control information associated with various information channels (e.g., control channels, data channels, and information related to a self-decodable PBCH design for polar codes, etc.). Information may be passed on to other components of the device. The receiver 610 may be an example of aspects of the transceiver 935 described with reference to FIG. 9. The receiver 610 may utilize a single antenna or a set of antennas.

Base station coding manager 615 may be an example of aspects of the base station coding manager 715, 815, or 915 as described with reference to FIGS. 7 through 9. Base station coding manager 615 and/or at least some of its various sub-components may be implemented in hardware, software executed by a processor, firmware, or any combination thereof. If implemented in software executed by a processor, the functions of the base station coding manager 615 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The base station coding manager 615 and/or at least some of its various sub-components may be physically located at various positions, including being distributed such that portions of functions are implemented at different physical locations by one or more physical devices. In some examples, base station coding manager 615 and/or at least some of its various sub-components may be a separate and distinct component in accordance with various aspects of the present disclosure. In other examples, base station coding manager 615 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Base station coding manager 615 may identify a set of information bits for encoding according to a polar code, where the set of information bits is associated with a PBCH transmission having a PBCH bandwidth, and may determine a number of encoded bits to transmit within a first subset of the PBCH bandwidth corresponding to a second signal transmission temporally proximate to the PBCH transmission. In some cases, base station coding manager 615 may assign respective sub-channels (e.g., polar channels) of the polar code to the set of information bits based on the determined number of encoded bits, and may generate a codeword based on the assigned respective sub-channels and the set of information bits. In some cases, base station coding manager 615 may map a subset of encoded bits of the codeword to the first subset of the PBCH bandwidth, where the subset of the encoded bits of the codeword includes encoded bits corresponding to the respective sub-channels, and may transmit at least the subset of the encoded bits of the codeword in the PBCH transmission.

Transmitter 620 may transmit signals generated by other components of the device. In some examples, the transmitter 620 may be collocated with a receiver 610 in a transceiver module. For example, the transmitter 620 may be an example of aspects of the transceiver 935 as described with reference to FIG. 9. The transmitter 620 may utilize a single antenna or a set of antennas.

Figure 7:
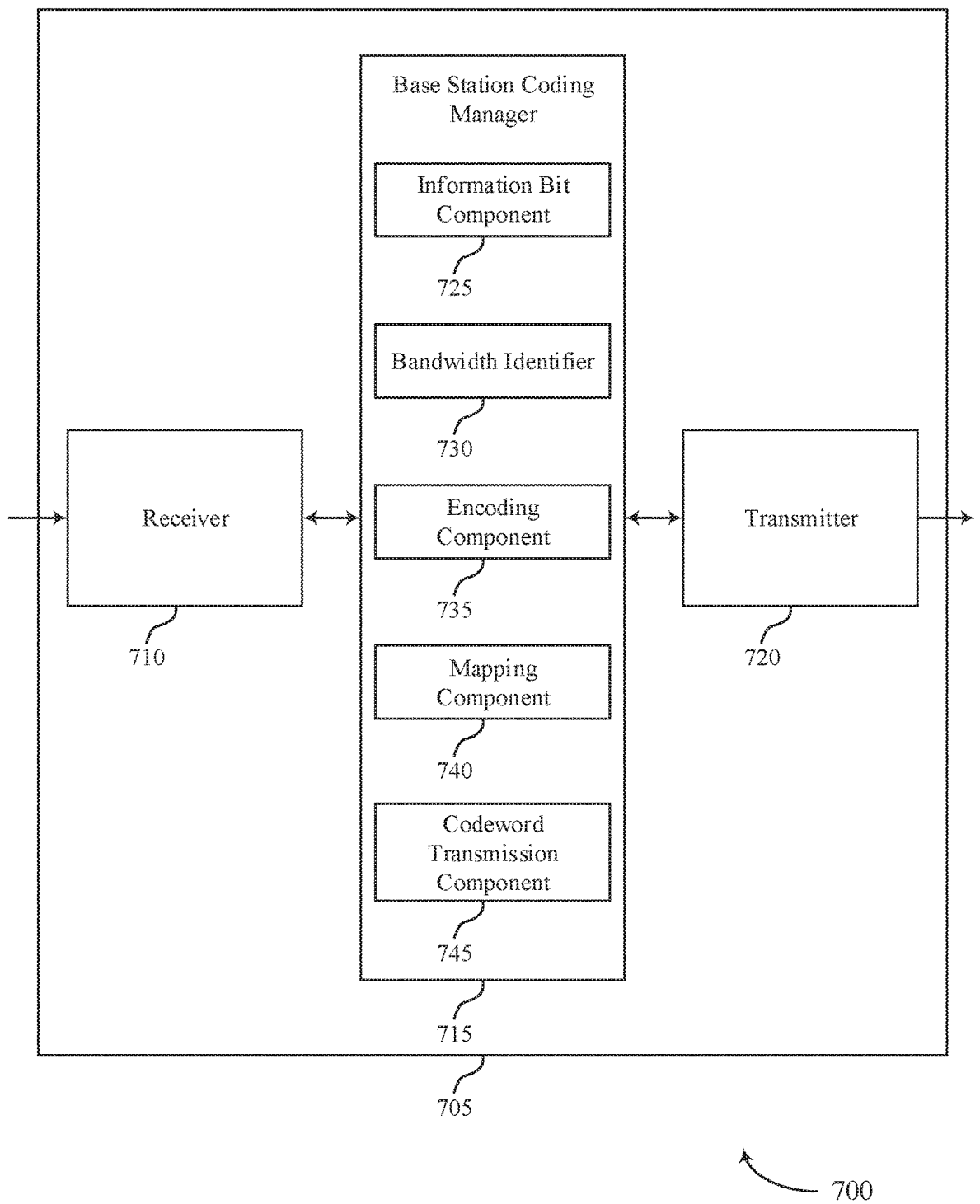

FIG. 7 shows a block diagram 700 of a wireless device 705 that supports a self-decodable PBCH design for polar codes in accordance with aspects of the present disclosure. Wireless device 705 may be an example of aspects of a wireless device 605 as described with reference to FIG. 6, or a base station 105 as described with reference to FIG. 1. Wireless device 705 may include receiver 710, base station coding manager 715, and transmitter 720. Wireless device 705 may also include a processor. Each of these components may be in communication with one another (e.g., via one or more buses).

Receiver 710 may receive information such as packets, user data, or control information associated with various information channels (e.g., control channels, data channels, and information related to a self-decodable PBCH design for polar codes, etc.). Information may be passed on to other components of the device. The receiver 710 may be an example of aspects of the transceiver 935 described with reference to FIG. 9. The receiver 710 may utilize a single antenna or a set of antennas.

Base station coding manager 715 may be an example of aspects of the coding manager 615, 815, or 915 as described with reference to FIGS. 6, 8, and 9. Base station coding manager 715 may also include information bit component 725, bandwidth identifier 730, encoding component 735, mapping component 740, and codeword transmission component 745.

Information bit component 725 may identify a set of information bits for encoding according to a polar code, the set of information bits associated with a PBCH transmission having a PBCH bandwidth.

Bandwidth identifier 730 may determine a number of encoded bits to transmit within a first subset of the PBCH bandwidth corresponding to a second signal transmission temporally proximate to the PBCH transmission. In some cases, bandwidth identifier 730 may identify a second subset of the PBCH bandwidth distinct from the first subset of the PBCH bandwidth. In some cases, the second signal transmission includes a synchronization signal transmission.

Encoding component 735 may assign respective sub-channels of the polar code to the set of information bits based on the determined number of encoded bits, and may generate a codeword based on the assigned respective sub-channels and the set of information bits.

Mapping component 740 may map a subset of encoded bits of the codeword to the first subset of the PBCH bandwidth, where the subset of the encoded bits of the codeword includes encoded bits corresponding to the respective sub-channels. In some cases, mapping component 740 may map an initial subset of the encoded bits of the codeword to a second subset of the PBCH bandwidth, where the initial subset of the encoded bits of the codeword includes encoded bits corresponding to an initial set of sub-channels. In some cases, mapping component 740 may map a repeated subset of the encoded bits of the codeword to a second subset of the PBCH bandwidth. In some cases, the mapping further includes mapping the subset of the encoded bits of the codeword to a first OFDM symbol and a second OFDM symbol in a frequency-first, time-second order. In some cases, the first OFDM symbol and the second OFDM symbol are separated in the time domain by resources assigned for the second signal transmission. Codeword transmission component 745 may transmit at least the subset of the encoded bits of the codeword in the PBCH transmission.

Transmitter 720 may transmit signals generated by other components of the device. In some examples, the transmitter 720 may be collocated with a receiver 710 in a transceiver module. For example, the transmitter 720 may be an example of aspects of the transceiver 935 described with reference to FIG. 9. The transmitter 720 may utilize a single antenna or a set of antennas.

Figure 8:
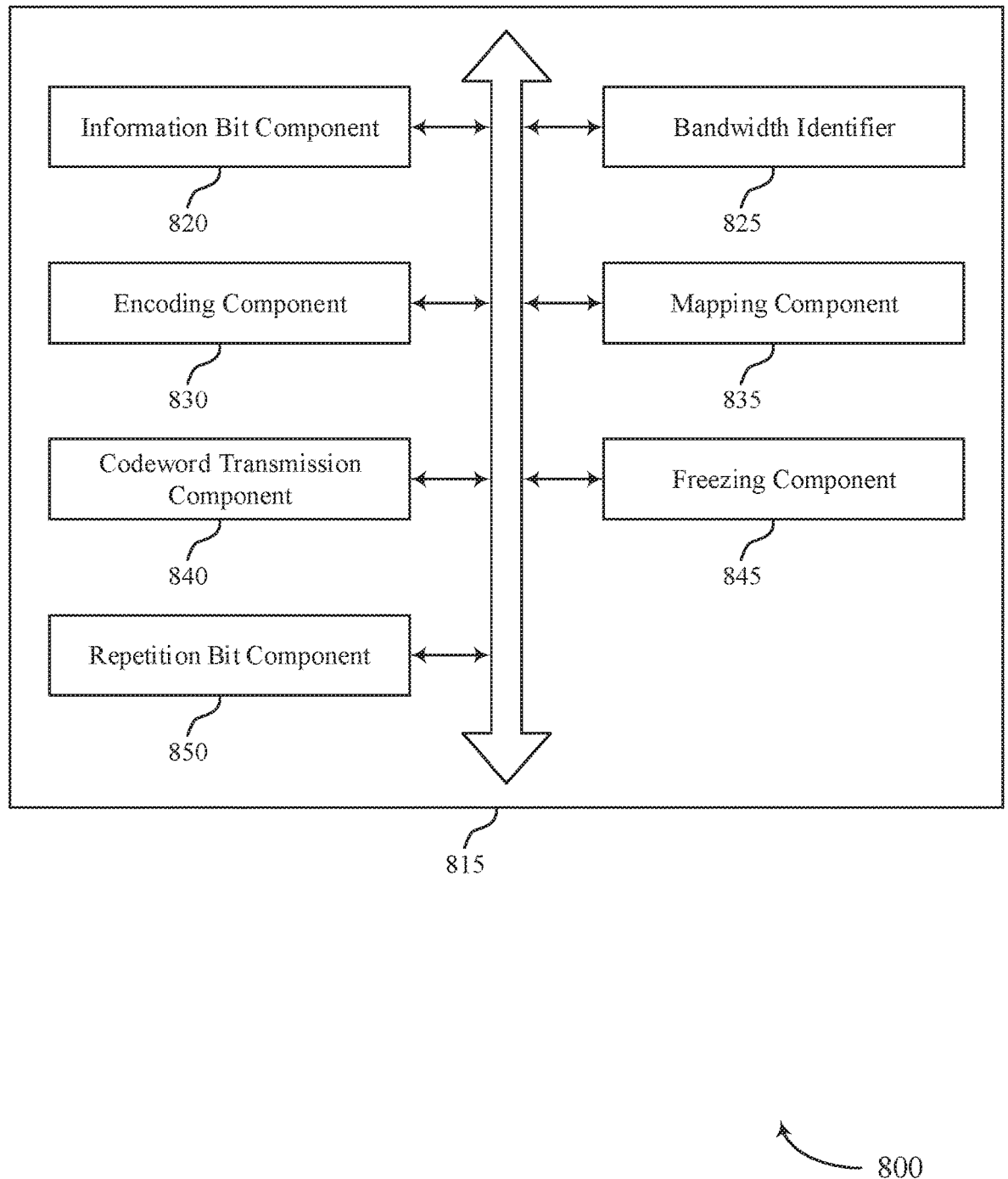

FIG. 8 shows a block diagram 800 of a base station coding manager 815 that supports a self-decodable PBCH design for polar codes in accordance with aspects of the present disclosure. The base station coding manager 815 may be an example of aspects of a base station coding manager 615, 715, or 915 as described with reference to FIG. 6, 7, or 9. The base station coding manager 815 may include information bit component 820, bandwidth identifier 825, encoding component 830, mapping component 835, codeword transmission component 840, freezing component 845, and repetition bit component 850. Each of these modules may communicate, directly or indirectly, with one another (e.g., via one or more buses).

Information bit component 820 may identify a set of information bits for encoding according to a polar code, the set of information bits associated with a PBCH transmission having a PBCH bandwidth.

Bandwidth identifier 825 may determine a number of encoded bits to transmit within a first subset of the PBCH bandwidth corresponding to a second signal transmission temporally proximate to the PBCH transmission. In some case, bandwidth identifier 825 may identify a second subset of the PBCH bandwidth distinct from the first subset of the PBCH bandwidth. In some cases, the second signal transmission includes a synchronization signal transmission.

Encoding component 830 may assign respective sub-channels of the polar code to the set of information bits based on the determined number of encoded bits. In some cases, encoding component 830 may generate a codeword based on the assigned respective sub-channels and the set of information bits.

Mapping component 835 may map a subset of encoded bits of the codeword to the first subset of the PBCH bandwidth, where the subset of the encoded bits of the codeword includes encoded bits corresponding to the respective sub-channels. In some cases, mapping component 835 may map an initial subset of the encoded bits of the codeword to a second subset of the PBCH bandwidth, where the initial subset of the encoded bits of the codeword includes encoded bits corresponding to an initial set of sub-channels. In some cases, mapping component 835 may map a repeated subset of the encoded bits of the codeword to a second subset of the PBCH bandwidth. In some cases, the mapping further includes mapping the subset of the encoded bits of the codeword to a first OFDM symbol and a second OFDM symbol in a frequency-first, time-second order. In some cases, the first OFDM symbol and the second OFDM symbol are separated in a time domain by resources assigned for the second signal transmission. Codeword transmission component 840 may transmit at least the subset of bits of the codeword in the PBCH transmission.

Freezing component 845 may determine a preliminary subset of sub-channels of the polar code corresponding to information bit locations based on the code length and a number of the set of information bits, and may re-assign at least one of the preliminary subset of sub-channels within the initial set of sub-channels to be a frozen bit location. In some cases, freezing component 845 may determine the sub-channels of the polar code for the plurality of information bits based at least in part on a code length and a number of the set of information bits, and may exclude the initial set of sub-channels. Repetition bit component 850 may determine the repeated subset of the encoded bits of the codeword for mapping to the second subset of the PBCH bandwidth for the PBCH transmission.

Figure 9:
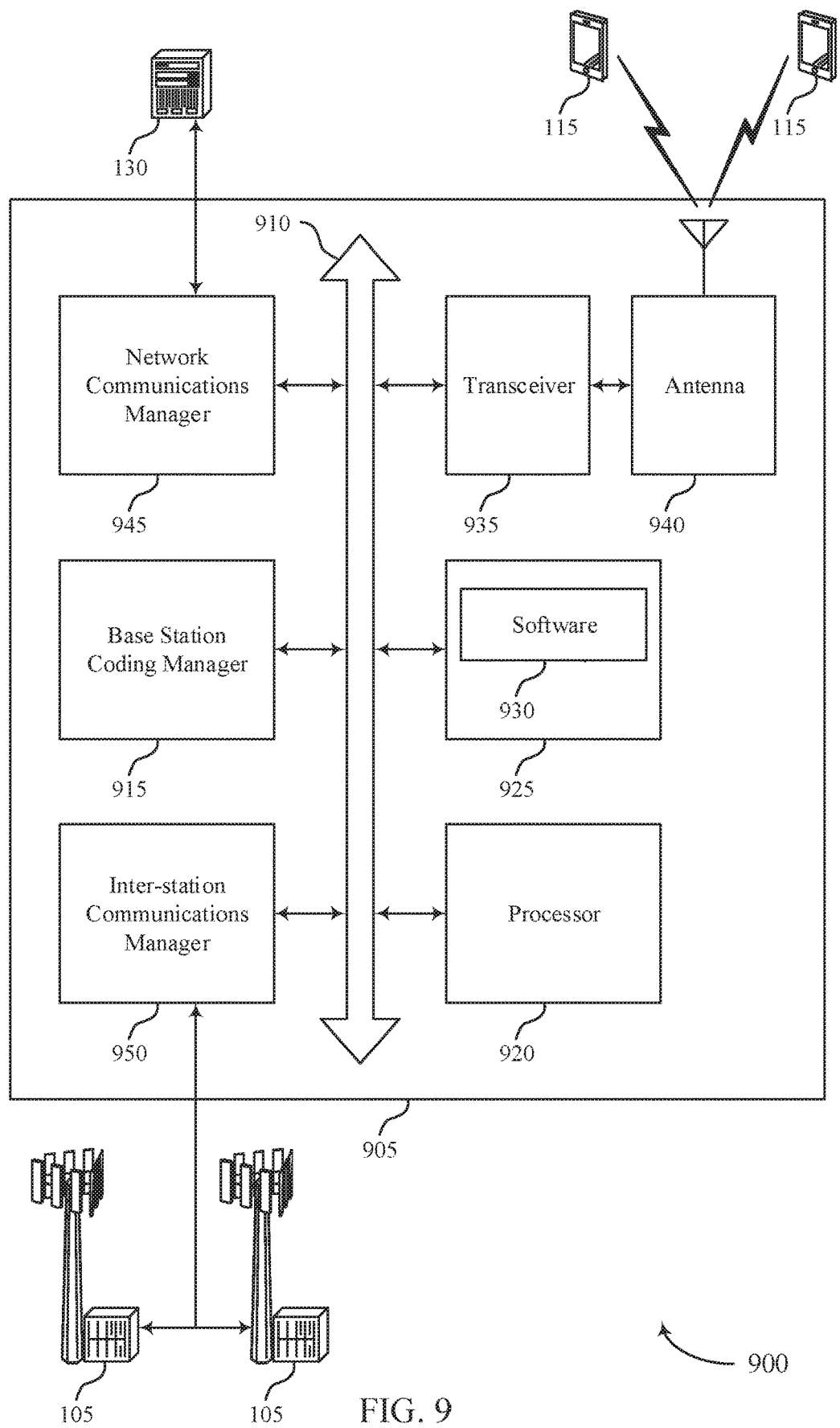
FIG. 9 illustrates a block diagram of a system including a base station in accordance with aspects of the present disclosure.

FIG. 9 shows a diagram of a system 900 including a device 905 that supports a self-decodable PBCH design for polar codes in accordance with aspects of the present disclosure. Device 905 may be an example of or include the components of wireless device 705, or a base station 105 as described above, e.g., with reference to FIGS. 1, 7 and 8. Device 905 may include components for bi-directional voice and data communications including components for transmitting and receiving communications, including base station coding manager 915, processor 920, memory 925, software 930, transceiver 935, antenna 940, network communications manager 945, and inter-station communications manager 950. These components may be in electronic communication via one or more buses (e.g., bus 910). Device 905 may communicate wirelessly with one or more UEs 115.

Processor 920 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 920 may be configured to operate a memory array using a memory controller. In other cases, a memory controller may be integrated into processor 920. Processor 920 may be configured to execute computer-readable instructions stored in a memory to perform various functions (e.g., functions or tasks supporting a self-decodable PBCH design for polar codes).

Memory 925 may include random-access memory (RAM) and read-only memory (ROM). The memory 925 may store computer-readable, computer-executable software 930 including instructions that, when executed, cause the processor to perform various functions described herein. In some cases, the memory 925 may contain, among other things, a BIOS which may control basic hardware or software operation such as the interaction with peripheral components or devices.

Software 930 may include code to implement aspects of the present disclosure, including code to support a self-decodable PBCH design for polar codes. Software 930 may be stored in a non-transitory computer-readable medium such as system memory or other memory. In some cases, the software 930 may not be directly executable by the processor but may cause a computer (e.g., when compiled and executed) to perform functions described herein.

Transceiver 935 may communicate bi-directionally, via one or more antennas, wired, or wireless links as described above. For example, the transceiver 935 may represent a wireless transceiver and may communicate bi-directionally with another wireless transceiver. The transceiver 935 may also include a modem to modulate the packets and provide the modulated packets to the antennas for transmission, and to demodulate packets received from the antennas.

In some cases, the wireless device may include a single antenna 940. However, in some cases the device may have more than one antenna 940, which may be capable of concurrently transmitting or receiving multiple wireless transmissions.

Network communications manager 945 may manage communications with the core network (e.g., via one or more wired backhaul links). For example, the network communications manager 945 may manage the transfer of data communications for client devices, such as one or more UEs 115.

Inter-station communications manager 950 may manage communications with other base station 105, and may include a controller or scheduler for controlling communications with UEs 115 in cooperation with other base stations 105. For example, the inter-station communications manager 950 may coordinate scheduling for transmissions to UEs 115 for various interference mitigation techniques such as beamforming or joint transmission. In some examples, inter-station communications manager 950 may provide an X2 interface within an LTE/LTE-A wireless communication network technology to provide communication between base stations 105.

Figure 10:
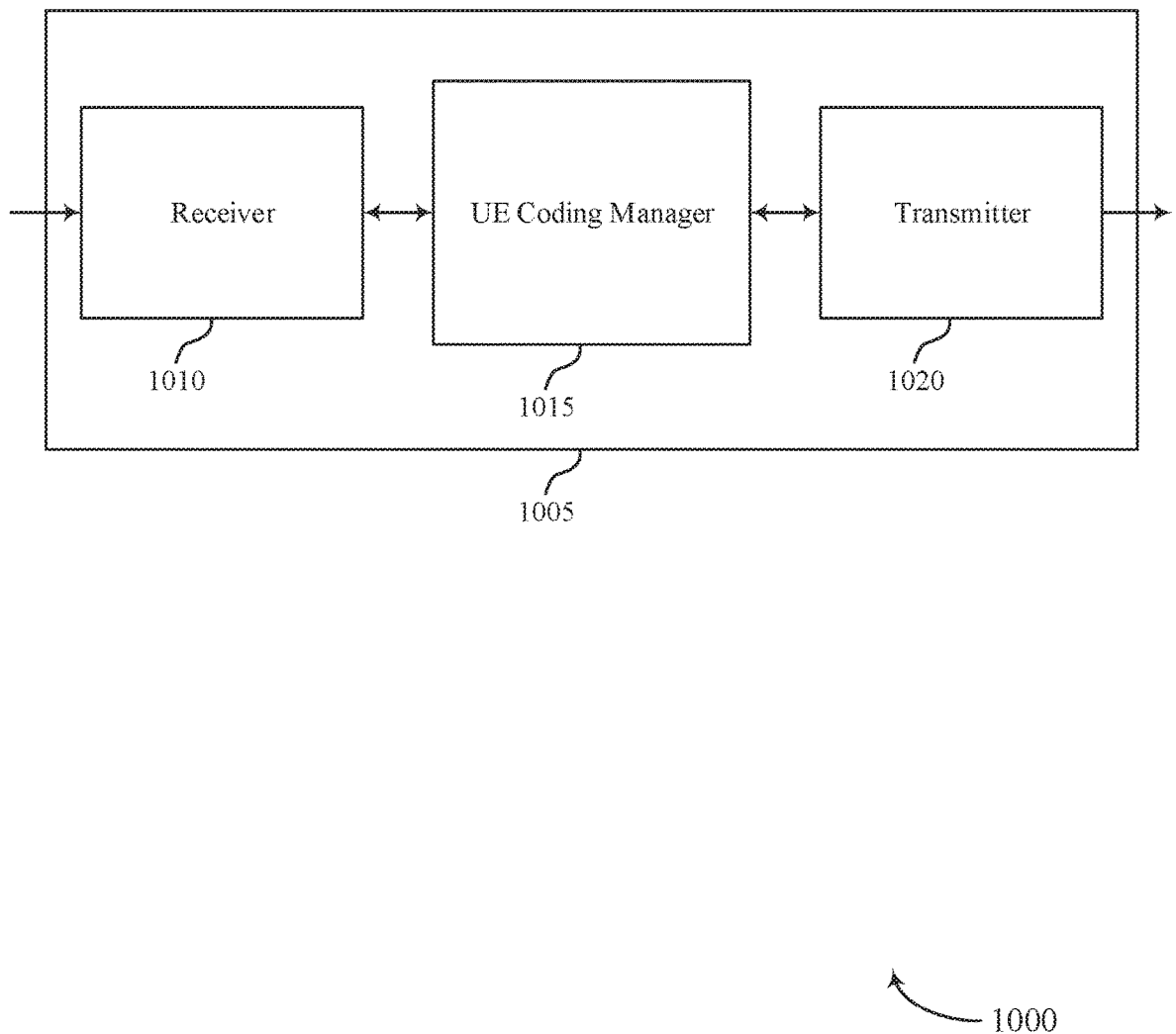
FIGS. 10 through 12 show block diagrams of a device in accordance with aspects of the present disclosure.

FIG. 10 shows a block diagram 1000 of a wireless device 1005 that supports a self-decodable PBCH design for polar codes in accordance with aspects of the present disclosure. Wireless device 1005 may be an example of aspects of a UE 115 as described herein. Wireless device 1005 may include receiver 1010, UE coding manager 1015, and transmitter 1020. Wireless device 1005 may also include a processor. Each of these components may be in communication with one another (e.g., via one or more buses).

Receiver 1010 may receive information such as packets, user data, or control information associated with various information channels (e.g., control channels, data channels, and information related to a self-decodable PBCH design for polar codes, etc.). Information may be passed on to other components of the device. The receiver 1010 may be an example of aspects of the transceiver 1335 described with reference to FIG. 13. The receiver 1010 may utilize a single antenna or a set of antennas.

UE coding manager 1015 may be an example of aspects of the UE coding manager 1115, 1215, or 1315 described with reference to FIGS. 11 through 13. UE coding manager 1015 and/or at least some of its various sub-components may be implemented in hardware, software executed by a processor, firmware, or any combination thereof. If implemented in software executed by a processor, the functions of the UE coding manager 1015 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure. The UE coding manager 1015 and/or at least some of its various sub-components may be physically located at various positions, including being distributed such that portions of functions are implemented at different physical locations by one or more physical devices. In some examples, UE coding manager 1015 and/or at least some of its various sub-components may be a separate and distinct component in accordance with various aspects of the present disclosure. In other examples, UE coding manager 1015 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

UE coding manager 1015 may identify a first subset of a PBCH bandwidth for a PBCH transmission, the first subset of the PBCH bandwidth corresponding to a second signal transmission temporally proximate to the PBCH transmission, and may receive a subset of encoded bits of a codeword of the PBCH transmission over the first subset of the PBCH bandwidth, the codeword generated from a set of information bits according to a polar code, where the PBCH transmission includes at least a second subset of the PBCH bandwidth that is distinct from the first subset of the PBCH bandwidth, and where an initial subset of the encoded bits of the codeword is mapped to the second subset of the PBCH bandwidth. In some cases, UE coding manager 1015 may perform a decoding process on the received subset of the encoded bits of the codeword to obtain the set of information bits, where respective sub-channels of the polar code assigned to the set of information bits are determined based on a number of encoded bits in the subset of encoded bits of the codeword. In some cases, a repeated subset of the encoded bits of the codeword may be mapped to the second subset of the PBCH bandwidth.

Transmitter 1020 may transmit signals generated by other components of the device. In some examples, the transmitter 1020 may be collocated with a receiver 1010 in a transceiver module. For example, the transmitter 1020 may be an example of aspects of the transceiver 1335 described with reference to FIG. 13. The transmitter 1020 may utilize a single antenna or a set of antennas.

Figure 11:
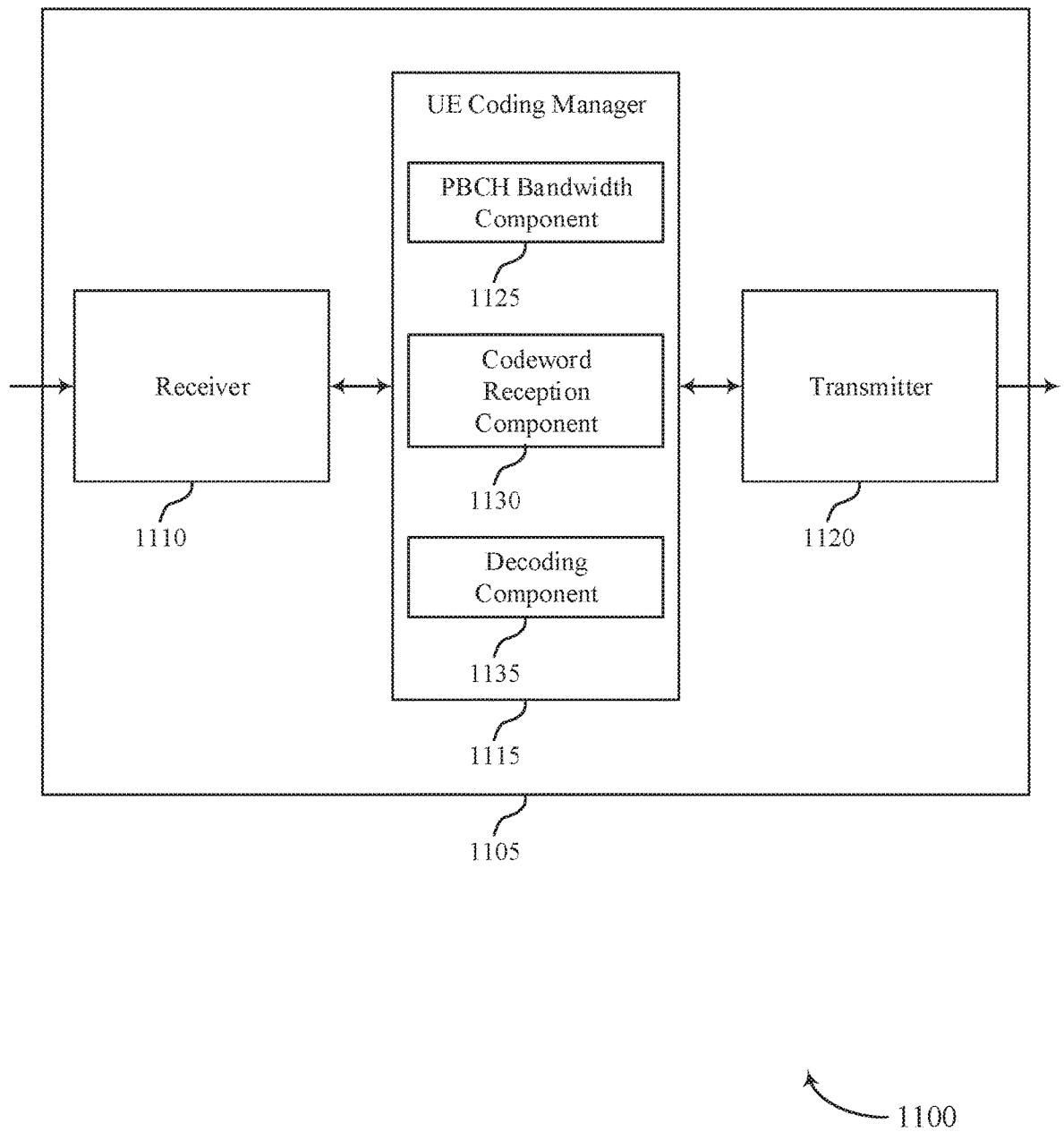

FIG. 11 shows a block diagram 1100 of a wireless device 1105 that supports a self-decodable PBCH design for polar codes in accordance with aspects of the present disclosure. Wireless device 1105 may be an example of aspects of a wireless device 1005 or a UE 115 as described with reference to FIG. 10. Wireless device 1105 may include receiver 1110, UE coding manager 1115, and transmitter 1120. Wireless device 1105 may also include a processor. Each of these components may be in communication with one another (e.g., via one or more buses).

Receiver 1110 may receive information such as packets, user data, or control information associated with various information channels (e.g., control channels, data channels, and information related to a self-decodable PBCH design for polar codes, etc.). Information may be passed on to other components of the device. The receiver 1110 may be an example of aspects of the transceiver 1335 described with reference to FIG. 13. The receiver 1110 may utilize a single antenna or a set of antennas.

UE coding manager 1115 may be an example of aspects of the UE coding manager 1015, 1215, or 1315 described with reference to FIGS. 10, 12, and 13. UE coding manager 1115 may also include PBCH bandwidth component 1125, codeword reception component 1130, and decoding component 1135.

PBCH bandwidth component 1125 may identify a first subset of a PBCH bandwidth for a PBCH transmission, the first subset of the PBCH bandwidth corresponding to a second signal transmission temporally proximate to the PBCH transmission. In some cases, the second signal transmission includes a synchronization signal transmission (e.g., a PSS or SSS).

Codeword reception component 1130 may receive a subset of encoded bits of a codeword of the PBCH transmission over the first subset of the PBCH bandwidth, the codeword generated from a set of information bits according to a polar code, where the PBCH transmission includes at least a second subset of the PBCH bandwidth that is distinct from the first subset of the PBCH bandwidth. In some examples, an initial subset of the encoded bits of the codeword may be mapped to the second subset of the PBCH bandwidth. In some cases, a repeated subset of the encoded bits of the codeword may be mapped to the second subset of the PBCH bandwidth. In some other cases, the PBCH transmission may further include at least a third subset of the PBCH bandwidth that is distinct from the first subset and the second subset of the PBCH bandwidth, where a repeated subset of the encoded bits of the codeword is mapped to the third subset of the PBCH bandwidth, and where the decoding process is performed on the received subset of the encoded bits of the codeword, the initial subset of the encoded bits of the codeword, and the repeated subset of the encoded bits of the codeword. In some cases, the receiving further includes receiving the subset of the encoded bits of the codeword from a first OFDM symbol and a second OFDM symbol in a frequency-first, time-second order.

Decoding component 1135 may perform a decoding process on the received subset of the encoded bits of the codeword to obtain the set of information bits, where respective sub-channels of the polar code assigned to the set of information bits are determined based on a number of encoded bits in the subset of encoded bits of the codeword. In some cases, decoding component 1135 may perform the decoding process on the received subset of the encoded bits of the codeword and the initial subset of the encoded bits of the codeword and the repeated subset of the encoded bits of the codeword mapped to the second subset of the PBCH bandwidth to obtain the set of information bits. In some cases, decoding component 1135 may perform a second decoding process on the received subset of the encoded bits of the codeword and the initial subset of the encoded bits of the codeword and the repeated subset of the encoded bits of the codeword mapped to the second subset of the PBCH bandwidth to obtain the set of information bits.

Transmitter 1120 may transmit signals generated by other components of the device. In some examples, the transmitter 1120 may be collocated with a receiver 1110 in a transceiver module. For example, the transmitter 1120 may be an example of aspects of the transceiver 1335 described with reference to FIG. 13. The transmitter 1120 may utilize a single antenna or a set of antennas.

Figure 12:
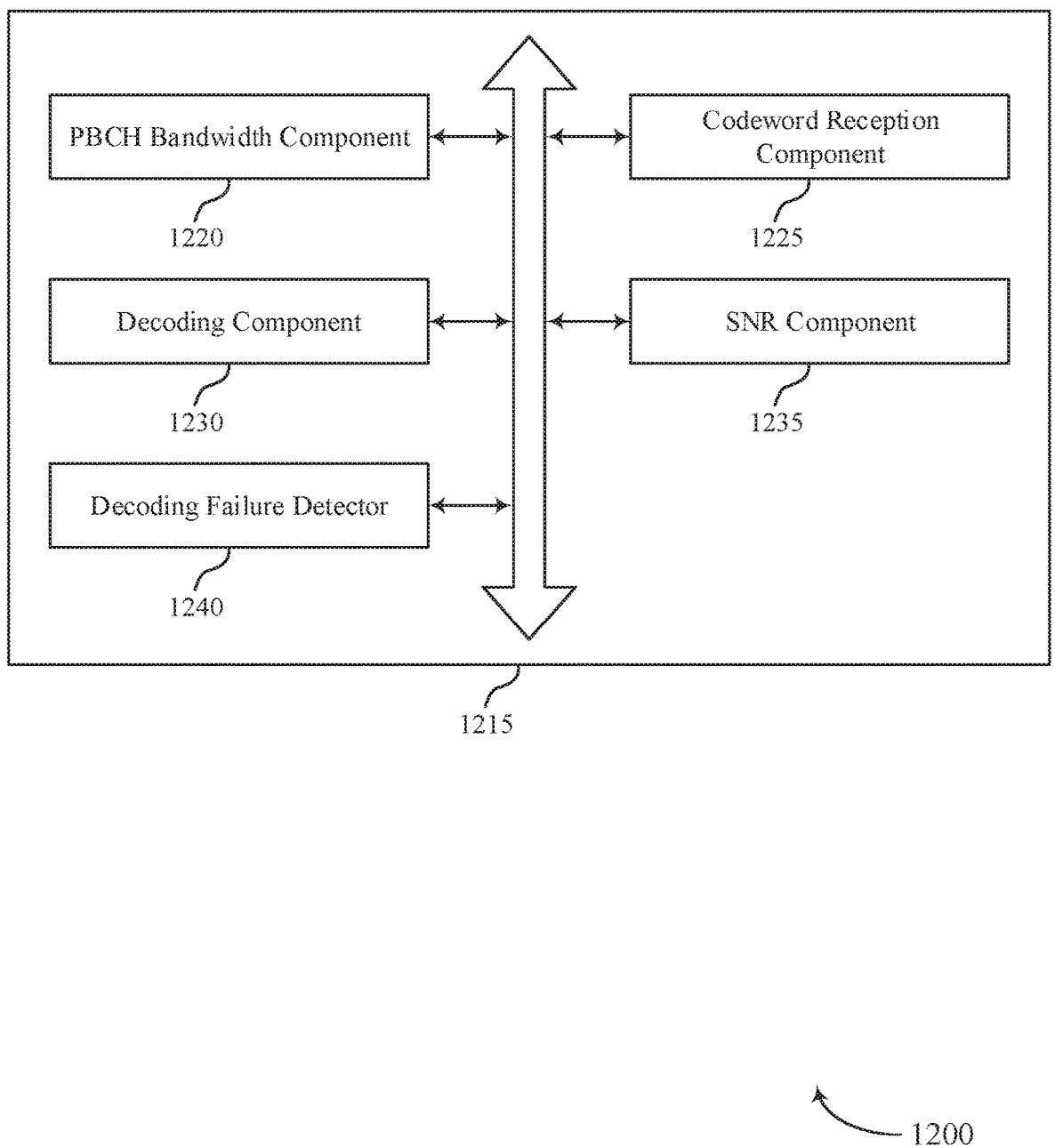

FIG. 12 shows a block diagram 1200 of a UE coding manager 1215 that supports a self-decodable PBCH design for polar codes in accordance with aspects of the present disclosure. The UE coding manager 1215 may be an example of aspects of a UE coding manager 1015, 1115, or 1315 described with reference to FIGS. 10, 11, and 13. The UE coding manager 1215 may include PBCH bandwidth component 1220, codeword reception component 1225, decoding component 1230, SNR component 1235, and decoding failure detector 1240. Each of these modules may communicate, directly or indirectly, with one another (e.g., via one or more buses).

PBCH bandwidth component 1220 may identify a first subset of a PBCH bandwidth for a PBCH transmission, the first subset of the PBCH bandwidth corresponding to a second signal transmission temporally proximate to the PBCH transmission. In some cases, the second signal transmission includes a synchronization signal transmission.

Codeword reception component 1225 may receive a subset of encoded bits of a codeword of the PBCH transmission over the first subset of the PBCH bandwidth, the codeword generated from a set of information bits according to a polar code, where the PBCH transmission includes at least a second subset of the PBCH bandwidth that is distinct from the first subset of the PBCH bandwidth, and where an initial subset of the encoded bits of the codeword is mapped to the second subset of the PBCH bandwidth. In some cases, a repeated subset of the encoded bits of the codeword are mapped to the second subset of the PBCH bandwidth. In some other cases, the PBCH transmission further includes at least a third subset of the PBCH bandwidth that is distinct from the first subset and the second subset of the PBCH bandwidth, where a repeated subset of the encoded bits of the codeword is mapped to the third subset of the PBCH bandwidth, and where the decoding process is performed on the received subset of the encoded bits of the codeword, the initial subset of the encoded bits of the codeword, and the repeated subset of the encoded bits of the codeword. In some cases, the receiving further includes receiving the subset of the encoded bits of the codeword from a first OFDM symbol and a second OFDM symbol in a frequency-first, time-second order.

Decoding component 1230 may perform a decoding process on the received subset of the encoded bits of the codeword to obtain the set of information bits, where respective sub-channels of the polar code assigned to the set of information bits are determined based on a number of encoded bits in the subset of encoded bits of the codeword. In some cases, decoding component 1230 may perform the decoding process on the received subset of the encoded bits of the codeword and the initial subset of the encoded bits of the codeword and the repeated subset of the encoded bits of the codeword mapped to the second subset of the PBCH bandwidth to obtain the set of information bits. In some cases, decoding component 1230 may perform a second decoding process on the received subset of the encoded bits of the codeword and the initial subset of the encoded bits of the codeword and the repeated subset of the encoded bits of the codeword mapped to the second subset of the PBCH bandwidth to obtain the set of information bits.

SNR component 1235 may identify that an SNR of the PBCH transmission over the first subset of the PBCH bandwidth is below a threshold. Decoding failure detector 1240 may determine a failure of the decoding process.

Figure 13:
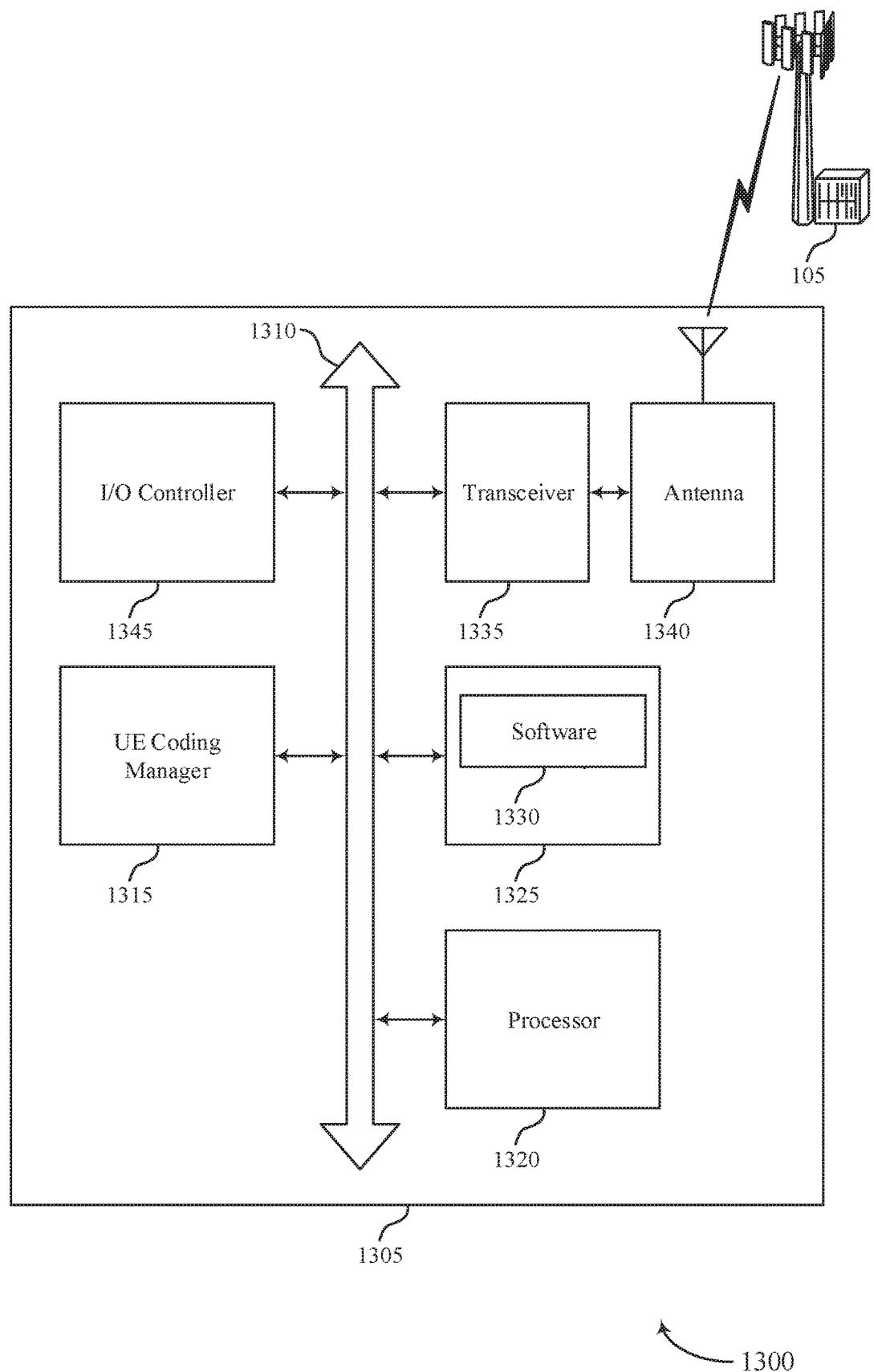
FIG. 13 illustrates a block diagram of a system including a UE in accordance with aspects of the present disclosure.

FIG. 13 shows a diagram of a system 1300 including a device 1305 that supports a self-decodable PBCH design for polar codes in accordance with aspects of the present disclosure. Device 1305 may be an example of or include the components of UE 115 as described above, e.g., with reference to FIG. 1. Device 1305 may include components for bi-directional voice and data communications including components for transmitting and receiving communications, including UE coding manager 1315, processor 1320, memory 1325, software 1330, transceiver 1335, antenna 1340, and I/O controller 1345. These components may be in electronic communication via one or more buses (e.g., bus 1310). Device 1305 may communicate wirelessly with one or more base stations 105.

Processor 1320 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1320 may be configured to operate a memory array using a memory controller. In other cases, a memory controller may be integrated into processor 1320. Processor 1320 may be configured to execute computer-readable instructions stored in a memory to perform various functions (e.g., functions or tasks supporting a self-decodable PBCH design for polar codes).

Memory 1325 may include RAM and ROM. The memory 1325 may store computer-readable, computer-executable software 1330 including instructions that, when executed, cause the processor to perform various functions described herein. In some cases, the memory 1325 may contain, among other things, a BIOS which may control basic hardware or software operation such as the interaction with peripheral components or devices.

Software 1330 may include code to implement aspects of the present disclosure, including code to support a self-decodable PBCH design for polar codes. Software 1330 may be stored in a non-transitory computer-readable medium such as system memory or other memory. In some cases, the software 1330 may not be directly executable by the processor but may cause a computer (e.g., when compiled and executed) to perform functions described herein.

Transceiver 1335 may communicate bi-directionally, via one or more antennas, wired, or wireless links as described above. For example, the transceiver 1335 may represent a wireless transceiver and may communicate bi-directionally with another wireless transceiver. The transceiver 1335 may also include a modem to modulate the packets and provide the modulated packets to the antennas for transmission, and to demodulate packets received from the antennas.

In some cases, the wireless device may include a single antenna 1340. However, in some cases the device may have more than one antenna 1340, which may be capable of concurrently transmitting or receiving multiple wireless transmissions.

I/O controller 1345 may manage input and output signals for device 1305. I/O controller 1345 may also manage peripherals not integrated into device 1305. In some cases, I/O controller 1345 may represent a physical connection or port to an external peripheral. In some cases, I/O controller 1345 may utilize an operating system such as iOS®, ANDROID®, MS-DOS®, MS-WINDOWS®, OS/2®, UNIX®, LINUX®, or another known operating system. In other cases, I/O controller 1345 may represent or interact with a modem, a keyboard, a mouse, a touchscreen, or a similar device. In some cases, I/O controller 1345 may be implemented as part of a processor. In some cases, a user may interact with device 1305 via I/O controller 1345 or via hardware components controlled by I/O controller 1345.

Figure 14:
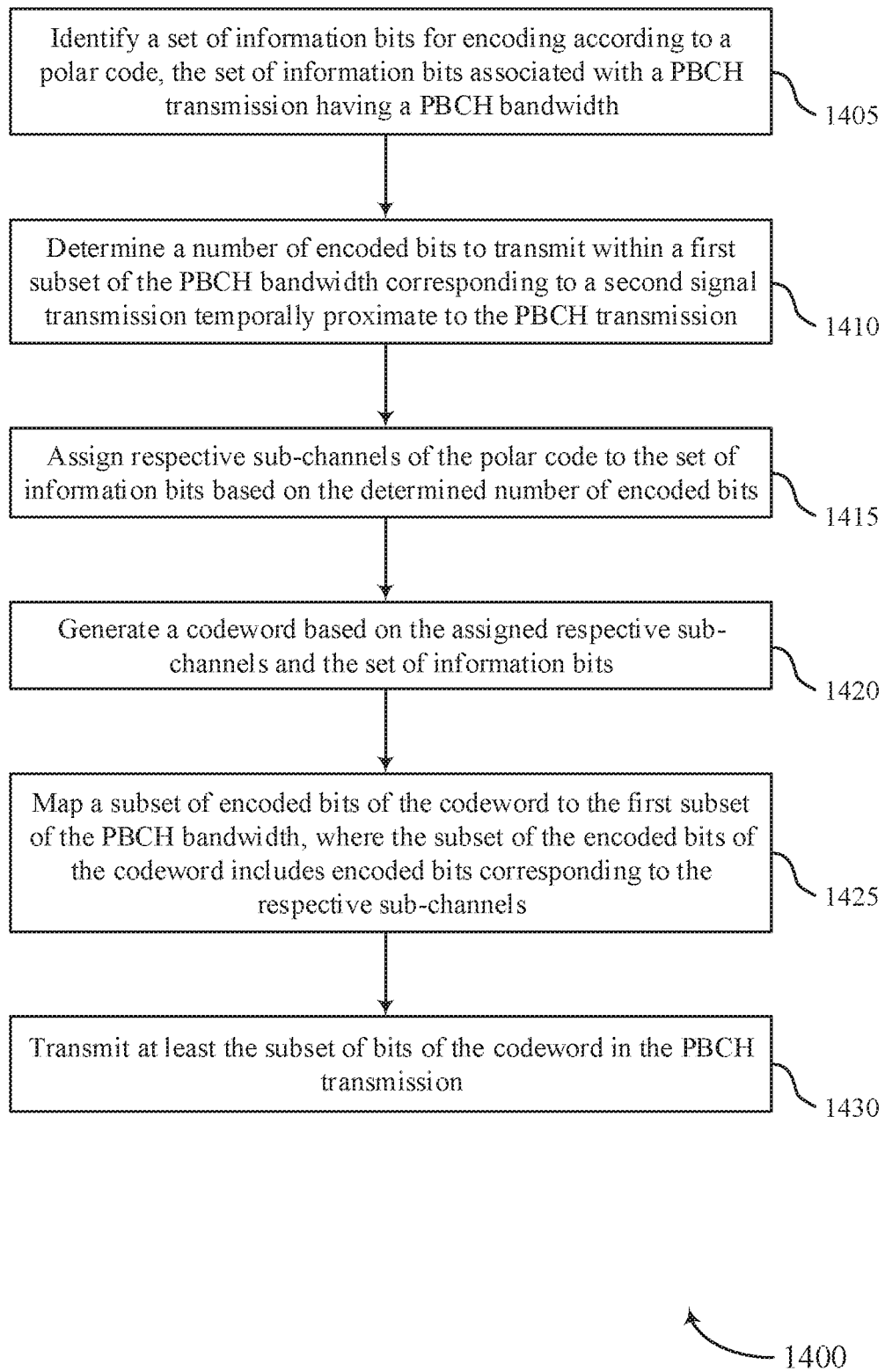
FIGS. 14 through 18 illustrate methods in accordance with aspects of the present disclosure.

FIG. 14 shows a flowchart illustrating a method 1400 for a self-decodable PBCH design for polar codes in accordance with aspects of the present disclosure. The operations of method 1400 may be implemented by a base station 105 or its components as described herein. For example, the operations of method 1400 may be performed by a base station coding manager as described with reference to FIGS. 6 through 9. In some examples, a base station 105 may execute a set of codes to control the functional elements of the device to perform the functions described below. Additionally or alternatively, the base station 105 may perform aspects of the functions described below using special-purpose hardware.

At block 1405 the base station 105 may identify a plurality of information bits for encoding according to a polar code, the plurality of information bits associated with a PBCH transmission having a PBCH bandwidth. The operations of block 1405 may be performed according to the methods described herein. In certain examples, aspects of the operations of block 1405 may be performed by an information bit component as described with reference to FIGS. 6 through 9.

At block 1410 the base station 105 may determine a number of encoded bits to transmit within a first subset of the PBCH bandwidth corresponding to a second signal transmission temporally proximate to the PBCH transmission. The operations of block 1410 may be performed according to the methods described herein. In certain examples, aspects of the operations of block 1410 may be performed by a bandwidth identifier as described with reference to FIGS. 6 through 9.

At block 1415 the base station 105 may assign respective sub-channels of the polar code to the plurality of information bits based at least in part on the determined number of encoded bits. The operations of block 1415 may be performed according to the methods described herein. In certain examples, aspects of the operations of block 1415 may be performed by an encoding component as described with reference to FIGS. 6 through 9.

At block 1420 the base station 105 may generate a codeword based at least in part on the assigned respective sub-channels and the plurality of information bits. The operations of block 1420 may be performed according to the methods described herein. In certain examples, aspects of the operations of block 1420 may be performed by an encoding component as described with reference to FIGS. 6 through 9.

At block 1425 the base station 105 may map a subset of encoded bits of the codeword to the first subset of the PBCH bandwidth, where the subset of the encoded bits of the codeword comprises encoded bits corresponding to the respective sub-channels. The operations of block 1425 may be performed according to the methods described herein. In certain examples, aspects of the operations of block 1425 may be performed by a mapping component as described with reference to FIGS. 6 through 9.

At block 1430 the base station 105 may transmit at least the subset of the encoded bits of the codeword in the PBCH transmission. The operations of block 1430 may be performed according to the methods described herein. In certain examples, aspects of the operations of block 1430 may be performed by a codeword transmission component as described with reference to FIGS. 6 through 9.

Figure 15:
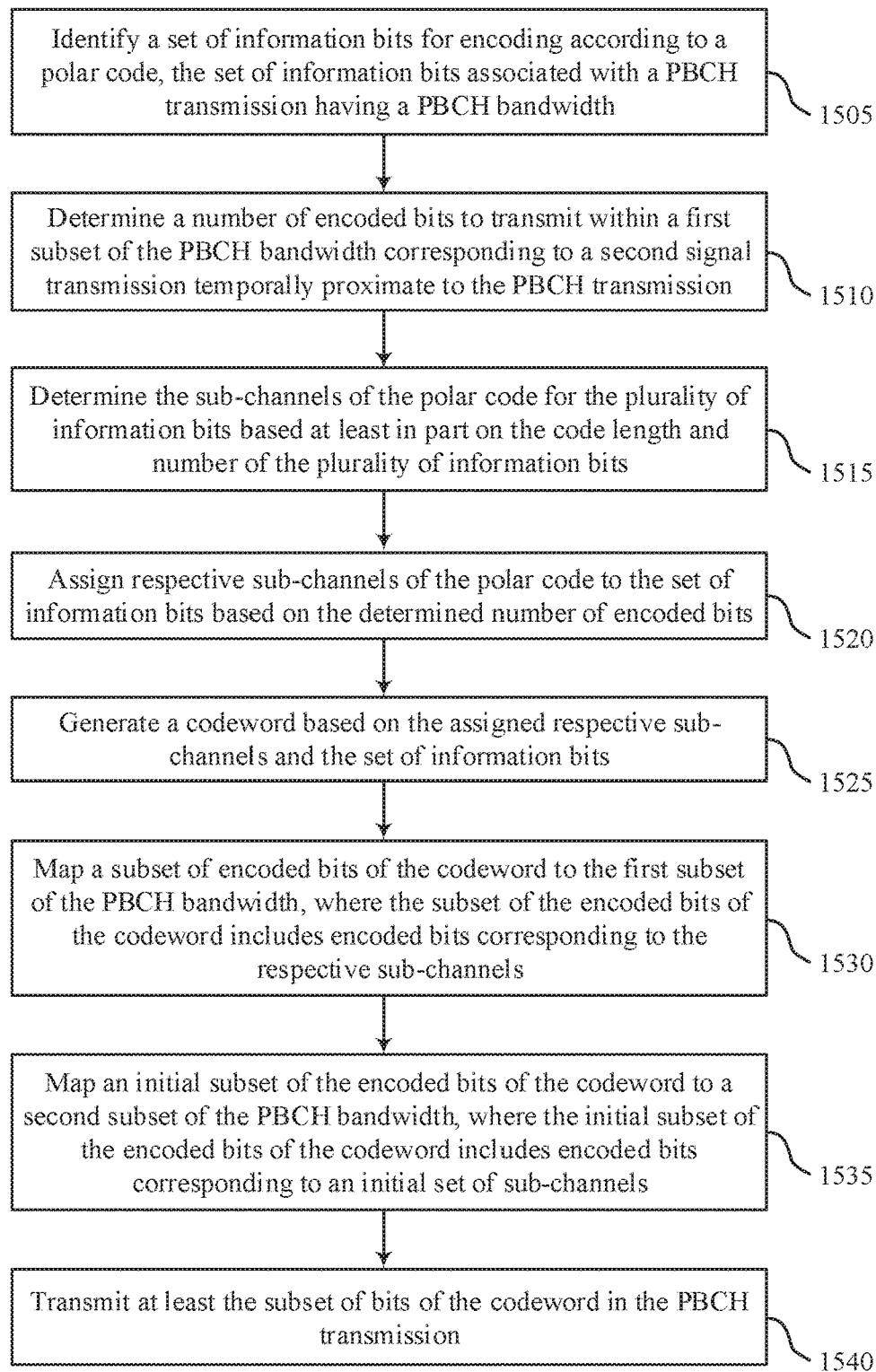

FIG. 15 shows a flowchart illustrating a method 1500 for a self-decodable PBCH design for polar codes in accordance with aspects of the present disclosure. The operations of method 1500 may be implemented by a base station 105 or its components as described herein. For example, the operations of method 1500 may be performed by a base station coding manager as described with reference to FIGS. 6 through 9. In some examples, a base station 105 may execute a set of codes to control the functional elements of the device to perform the functions described below. Additionally or alternatively, the base station 105 may perform aspects of the functions described below using special-purpose hardware.

At block 1505 the base station 105 may identify a plurality of information bits for encoding according to a polar code, the plurality of information bits associated with a PBCH transmission having a PBCH bandwidth. The operations of block 1505 may be performed according to the methods described herein. In certain examples, aspects of the operations of block 1505 may be performed by an information bit component as described with reference to FIGS. 6 through 9.

At block 1510 the base station 105 may determine a number of encoded bits to transmit within a first subset of the PBCH bandwidth corresponding to a second signal transmission temporally proximate to the PBCH transmission. The operations of block 1510 may be performed according to the methods described herein. In certain examples, aspects of the operations of block 1510 may be performed by a bandwidth identifier as described with reference to FIGS. 6 through 9.

At block 1515 the base station 105 may determine the sub-channels of the polar code for the plurality of information bits based at least in part on a code length and a number of the plurality of information bits. In some examples, at block 1515, the base station 105 may determine the sub-channels of the polar code the sub-channels of the polar code for the plurality of information bits based at least in part on excluding the initial set of sub-channels. In some cases, aspects of the operations of block 1515 may be performed by a freezing component as described with reference to FIGS. 6 through 9. The operations of block 1515 may be performed according to the methods described herein. In certain examples, aspects of the operations of block 1515 may be performed by a freezing component as described with reference to FIGS. 6 through 9.

At block 1520 the base station 105 may assign respective sub-channels of the polar code to the plurality of information bits based at least in part on the determined number of encoded bits. The operations of block 1520 may be performed according to the methods described herein. In certain examples, aspects of the operations of block 1520 may be performed by an encoding component as described with reference to FIGS. 6 through 9.

At block 1525 the base station 105 may generate a codeword based at least in part on the assigned respective sub-channels and the plurality of information bits. The operations of block 1525 may be performed according to the methods described herein. In certain examples, aspects of the operations of block 1525 may be performed by an encoding component as described with reference to FIGS. 6 through 9.

At block 1530 the base station 105 may map a subset of encoded bits of the codeword to the first subset of the PBCH bandwidth, where the subset of the encoded bits of the codeword comprises encoded bits corresponding to the respective sub-channels. The operations of block 1530 may be performed according to the methods described herein. In certain examples, aspects of the operations of block 1530 may be performed by a mapping component as described with reference to FIGS. 6 through 9.

At block 1535 the base station 105 may map an initial subset of the encoded bits of the codeword to a second subset of the PBCH bandwidth, where the initial subset of the encoded bits of the codeword comprises encoded bits corresponding to an initial set of sub-channels. The operations of block 1535 may be performed according to the methods described herein. In certain examples, aspects of the operations of block 1535 may be performed by a mapping component as described with reference to FIGS. 6 through 9.

At block 1540 the base station 105 may transmit at least the subset of the encoded bits of the codeword in the PBCH transmission. The operations of block 1540 may be performed according to the methods described herein. In certain examples, aspects of the operations of block 1540 may be performed by a codeword transmission component as described with reference to FIGS. 6 through 9.

Figure 16:
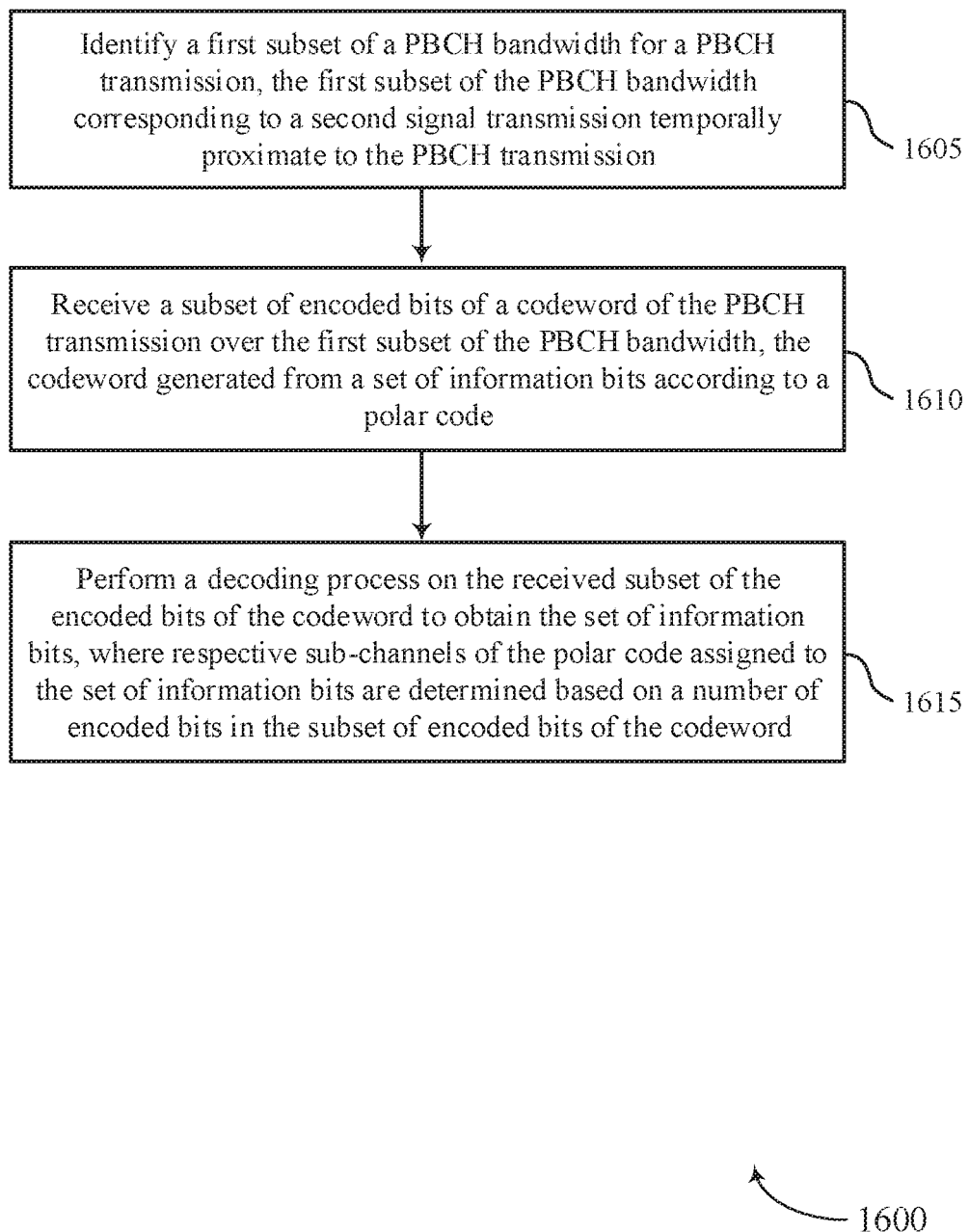

FIG. 16 shows a flowchart illustrating a method 1600 for a self-decodable PBCH design for polar codes in accordance with aspects of the present disclosure. The operations of method 1600 may be implemented by a UE 115 or its components as described herein. For example, the operations of method 1600 may be performed by a UE coding manager as described with reference to FIGS. 10 through 13. In some examples, a UE 115 may execute a set of codes to control the functional elements of the device to perform the functions described below. Additionally or alternatively, the UE 115 may perform aspects of the functions described below using special-purpose hardware.

At block 1605 the UE 115 may identify a first subset of a PBCH bandwidth for a PBCH transmission, the first subset of the PBCH bandwidth corresponding to a second signal transmission temporally proximate to the PBCH transmission. The operations of block 1605 may be performed according to the methods described herein. In certain examples, aspects of the operations of block 1605 may be performed by a PBCH bandwidth component as described with reference to FIGS. 10 through 13.

At block 1610 the UE 115 may receive a subset of encoded bits of a codeword of the PBCH transmission over the first subset of the PBCH bandwidth, the codeword generated from a plurality of information bits according to a polar code, where the PBCH transmission comprises at least a second subset of the PBCH bandwidth that is distinct from the first subset of the PBCH bandwidth, and where an initial subset of the encoded bits of the codeword and a repeated subset of the encoded bits of the codeword are mapped to the second subset of the PBCH bandwidth. The operations of block 1610 may be performed according to the methods described herein. In certain examples, aspects of the operations of block 1610 may be performed by a codeword reception component as described with reference to FIGS. 10 through 13.

At block 1615 the UE 115 may perform a decoding process on the received subset of the encoded bits of the codeword to obtain the plurality of information bits, where respective sub-channels of the polar code assigned to the plurality of information bits are determined based at least in part on a number of encoded bits in the subset of encoded bits of the codeword. The operations of block 1615 may be performed according to the methods described herein. In certain examples, aspects of the operations of block 1615 may be performed by a decoding component as described with reference to FIGS. 10 through 13.

Figure 17:
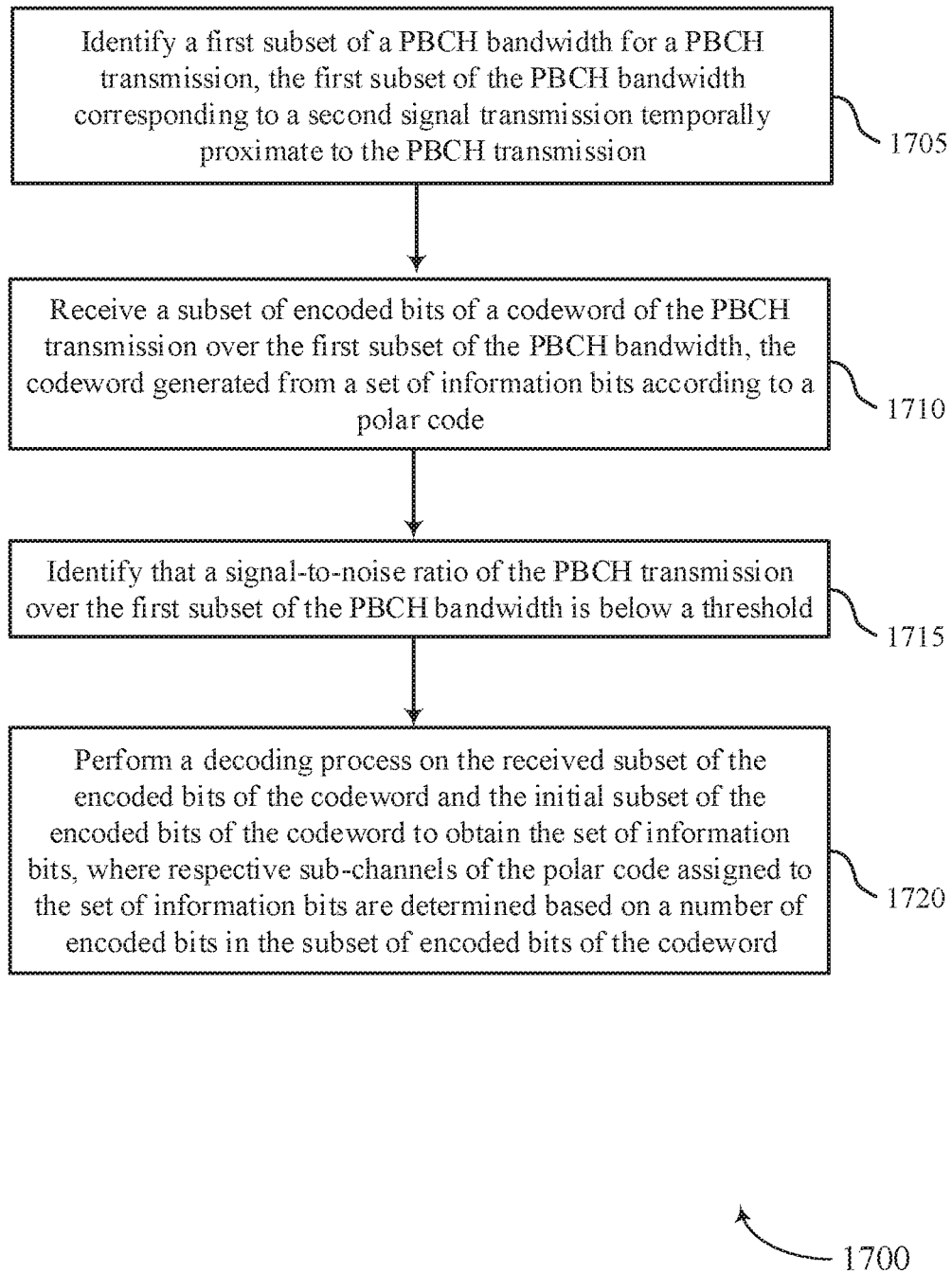

FIG. 17 shows a flowchart illustrating a method 1700 for a self-decodable PBCH design for polar codes in accordance with aspects of the present disclosure. The operations of method 1700 may be implemented by a UE 115 or its components as described herein. For example, the operations of method 1700 may be performed by a UE coding manager as described with reference to FIGS. 10 through 13. In some examples, a UE 115 may execute a set of codes to control the functional elements of the device to perform the functions described below. Additionally or alternatively, the UE 115 may perform aspects of the functions described below using special-purpose hardware.

At block 1705 the UE 115 may identify a first subset of a PBCH bandwidth for a PBCH transmission, the first subset of the PBCH bandwidth corresponding to a second signal transmission temporally proximate to the PBCH transmission. The operations of block 1705 may be performed according to the methods described herein. In certain examples, aspects of the operations of block 1705 may be performed by a PBCH bandwidth component as described with reference to FIGS. 10 through 13.

At block 1710 the UE 115 may receive a subset of encoded bits of a codeword of the PBCH transmission over the first subset of the PBCH bandwidth, the codeword generated from a plurality of information bits according to a polar code, where the PBCH transmission comprises at least a second subset of the PBCH bandwidth that is distinct from the first subset of the PBCH bandwidth, and where an initial subset of the encoded bits of the codeword and a repeated subset of the encoded bits of the codeword are mapped to the second subset of the PBCH bandwidth. The operations of block 1710 may be performed according to the methods described herein. In certain examples, aspects of the operations of block 1710 may be performed by a codeword reception component as described with reference to FIGS. 10 through 13.

At block 1715 the UE 115 may identify that an SNR of the PBCH transmission over the first subset of the PBCH bandwidth is below a threshold. The operations of block 1715 may be performed according to the methods described herein. In certain examples, aspects of the operations of block 1715 may be performed by an SNR component as described with reference to FIGS. 10 through 13.

At block 1720 the UE 115 may perform a decoding process on the received subset of the encoded bits of the codeword and the initial subset of the encoded bits of the codeword mapped to the second subset of the PBCH bandwidth to obtain the plurality of information bits, where respective sub-channels of the polar code assigned to the plurality of information bits are determined based at least in part on a number of encoded bits in the subset of encoded bits of the codeword. The operations of block 1720 may be performed according to the methods described herein. In certain examples, aspects of the operations of block 1720 may be performed by a decoding component as described with reference to FIGS. 10 through 13.

Figure 18:
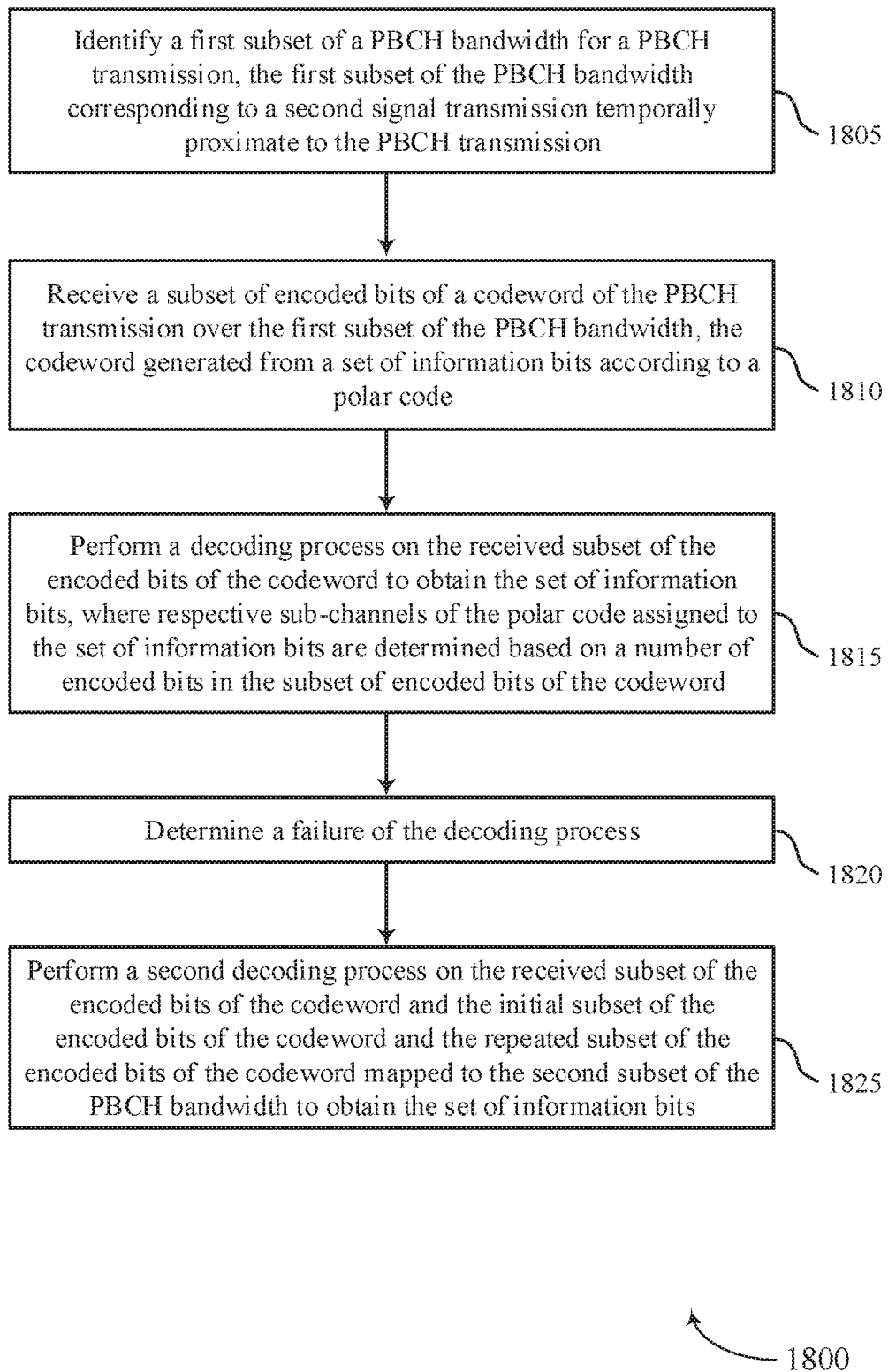

FIG. 18 shows a flowchart illustrating a method 1800 for a self-decodable PBCH design for polar codes in accordance with aspects of the present disclosure. The operations of method 1800 may be implemented by a UE 115 or its components as described herein. For example, the operations of method 1800 may be performed by a UE coding manager as described with reference to FIGS. 10 through 13. In some examples, a UE 115 may execute a set of codes to control the functional elements of the device to perform the functions described below. Additionally or alternatively, the UE 115 may perform aspects of the functions described below using special-purpose hardware.

At block 1805 the UE 115 may identify a first subset of a PBCH bandwidth for a PBCH transmission, the first subset of the PBCH bandwidth corresponding to a second signal transmission temporally proximate to the PBCH transmission. The operations of block 1805 may be performed according to the methods described herein. In certain examples, aspects of the operations of block 1805 may be performed by a PBCH bandwidth component as described with reference to FIGS. 10 through 13.

At block 1810 the UE 115 may receive a subset of encoded bits of a codeword of the PBCH transmission over the first subset of the PBCH bandwidth, the codeword generated from a plurality of information bits according to a polar code, where the PBCH transmission comprises at least a second subset of the PBCH bandwidth that is distinct from the first subset of the PBCH bandwidth, and where an initial subset of the encoded bits of the codeword and a repeated subset of the encoded bits of the codeword are mapped to the second subset of the PBCH bandwidth. The operations of block 1810 may be performed according to the methods described herein. In certain examples, aspects of the operations of block 1810 may be performed by a codeword reception component as described with reference to FIGS. 10 through 13.

At block 1815 the UE 115 may perform a decoding process on the received subset of the encoded bits of the codeword to obtain the plurality of information bits, where respective sub-channels of the polar code assigned to the plurality of information bits are determined based at least in part on a number of encoded bits in the subset of encoded bits of the codeword. The operations of block 1815 may be performed according to the methods described herein. In certain examples, aspects of the operations of block 1815 may be performed by a decoding component as described with reference to FIGS. 10 through 13.

At block 1820 the UE 115 may determine a failure of the decoding process. The operations of block 1820 may be performed according to the methods described herein. In certain examples, aspects of the operations of block 1820 may be performed by a decoding failure detector as described with reference to FIGS. 10 through 13.

At block 1825 the UE 115 may perform a second decoding process on the received subset of the encoded bits of the codeword and the initial subset of the encoded bits of the codeword mapped to the second subset of the PBCH bandwidth to obtain the plurality of information bits. The operations of block 1825 may be performed according to the methods described herein. In certain examples, aspects of the operations of block 1825 may be performed by a decoding component as described with reference to FIGS. 10 through 13.

It should be noted that the methods described above describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), FDMA, orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, a field-programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read-only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
identifying a plurality of information bits for encoding according to a polar code, the plurality of information bits associated with a physical broadcast channel (PBCH) transmission having a PBCH bandwidth;
determining a number of encoded bits to transmit within a first subset of the PBCH bandwidth corresponding to a second signal transmission temporally proximate to the PBCH transmission;
assigning respective sub-channels of the polar code to the plurality of information bits based at least in part on the determined number of encoded hits;
generating a codeword based at least in part on the assigned respective sub-channels and the plurality of information bits;
mapping a subset of encoded bits of the codeword to the first subset of the PBCH bandwidth, wherein the subset of the encoded bits of the codeword comprises encoded bits corresponding to the respective sub-channels; and
transmitting at least the subset of the encoded bits of the codeword in the PBCH transmission.

2. The method of claim 1, further comprising:
mapping an initial subset of the encoded hits of the codeword to a second subset of the PBCH bandwidth, wherein the initial subset of the encoded bits of the codeword comprises encoded bits corresponding to an initial set of sub-channels.

3. The method of claim 2, further comprising:
determining the sub-channels of the polar code for the plurality of information hits based at least in part on a code length and a number of the plurality of information bits.

4. The method of claim 3, wherein determining the sub-channels of the polar code further comprises:
determining the sub-channels of the polar code for the plurality of information bits based at least in part on excluding the initial set of sub-channels.

5. The method of claim 1, further comprising:
identifying a second subset of the PBCH bandwidth distinct from the first subset of the PBCH bandwidth;
determining a repeated subset of the encoded bits of the codeword for mapping to the second subset of the PBCH bandwidth for the PBCH transmission; and
mapping the repeated subset of the encoded bits of the codeword to the second subset of the PBCH bandwidth.

6. The method of claim 1, wherein the mapping further comprises:
mapping the subset of the encoded bits of the codeword to a first orthogonal frequency-division multiplexing (OFDM) symbol and a second OFDM symbol in a frequency-first, time-second order.

7. The method of claim 6, wherein the first OFDM symbol and the second OFDM symbol are separated in a time domain by resources assigned for the second signal transmission.

8. The method of claim 1, wherein the second signal transmission comprises a synchronization signal transmission.

9. A method for wireless communication, comprising:
identifying a first subset of a physical broadcast channel (PBCH) bandwidth for a PBCH transmission, the first subset of the PBCH bandwidth corresponding to a second signal transmission temporally proximate to the PBCH transmission;
receiving a subset of encoded bits of a codeword of the PBCH transmission over the first subset of the PBCH bandwidth, the codeword generated from a plurality of information bits according to a polar code, wherein the PBCH transmission comprises at least a second subset of the PBCH bandwidth that is distinct from the first subset of the PBCH bandwidth, and wherein an initial subset of the encoded bits of the codeword and a repeated subset of the encoded bits of the codeword are mapped to the second subset of the PBCH bandwidth; and
performing a decoding process on the received subset of the encoded bits of the codeword to obtain the plurality of information bits, wherein respective sub-channels of the polar code assigned to the plurality of information bits are determined based at least in part on a number of encoded bits in the subset of encoded bits of the codeword.

10. The method of claim 9, further comprising:
identifying that a signal-to-noise ratio (SNR) of the PBCH transmission over the first subset of the PBCH bandwidth is below a threshold.

11. The method of claim 10, further comprising:
performing the decoding process on the received subset of the encoded bits of the codeword, the initial subset of the encoded bits of the codeword, and the repeated subset of the encoded bits of the codeword mapped to the second subset of the PBCH bandwidth to obtain the plurality of information bits.

12. The method of claim 9, further comprising:
determining a failure of the decoding process.

13. The method of claim 12, further comprising:
performing a second decoding process on the received subset of the encoded bits of the codeword, the initial subset of the encoded bits of the codeword, and the repeated subset of the encoded bits of the codeword mapped to the second subset of the PBCH bandwidth to obtain the plurality of information bits.

14. The method of claim 9, wherein the receiving further comprises:
receiving the subset of the encoded bits of the codeword from a first orthogonal frequency-division multiplexing (OFDM) symbol and a second OFDM symbol in a frequency-first, time-second order.

15. The method of claim 9, wherein the second signal transmission comprises a synchronization signal transmission.

16. An apparatus for wireless communication, comprising:
means for identifying a plurality of information bits for encoding according to a polar code, the plurality of information bits associated with a physical broadcast channel (PBCH) transmission having a PBCH bandwidth;
means for determining a number of encoded bits to transmit within a first subset of the PBCH bandwidth corresponding to a second signal transmission temporally proximate to the PBCH transmission;
means for assigning respective sub-channels of the polar code to the plurality of information bits based at least in part on the determined number of encoded bits;
means for generating a codeword based at least in part on the assigned respective sub-channels and the plurality of information bits;
means for mapping a subset of encoded bits of the codeword to the first subset of the PBCH bandwidth, wherein the subset of the encoded bits of the codeword comprises encoded bits corresponding to the respective sub-channels; and
means for transmitting at least the subset of the encoded bits of the codeword in the PBCH transmission.

17. The apparatus of claim 16, further comprising:
means for mapping an initial subset of the encoded bits of the codeword to a second subset of the PBCH bandwidth, wherein the initial subset of the encoded bits of the codeword comprises encoded bits corresponding to an initial set of sub-channels.

18. The apparatus of claim 17, further comprising:
means for determining the sub-channels of the polar code for the plurality of information bits based at least in part on a code length and a number of the plurality of information bits.

19. The apparatus of claim 18, wherein the means for determining the sub-channels of the polar code further comprises:

means for determining the sub-channels of the polar code for the plurality of information bits based at least in part on excluding the initial set of sub-channels.

20. The apparatus of claim 16, further comprising:
means for identifying a second subset of the PBCH bandwidth distinct from the first subset of the PBCH bandwidth;
means for determining a repeated subset of the encoded bits of the codeword for mapping to the second subset of the PBCH bandwidth for the PBCH transmission; and
means for mapping the repeated subset of the encoded bits of the codeword to the second subset of the PBCH bandwidth.

21. The apparatus of claim 16, wherein the means for mapping further comprises:
means for mapping the subset of the encoded bits of the codeword to a first orthogonal frequency-division multiplexing (OFDM) symbol and a second OFDM symbol in a frequency-first, time-second order.

22. The apparatus of claim 21, wherein the first OFDM symbol and the second OFDM symbol are separated in a time domain by resources assigned for the second signal transmission.

23. The apparatus of claim 16, wherein the second signal transmission comprises a synchronization signal transmission.

24. An apparatus for wireless communication, comprising:
means for identifying a first subset of a physical broadcast channel (PBCH) bandwidth for a PBCH transmission, the first subset of the PBCH bandwidth corresponding to a second signal transmission temporally proximate to the PBCH transmission;
means for receiving a subset of encoded bits of a codeword of the PBCH transmission over the first subset of the PBCH bandwidth, the codeword generated from a plurality of information bits according to a polar code, wherein the PBCH transmission comprises at least a second subset of the PBCH bandwidth that is distinct from the first subset of the PBCH bandwidth, and wherein an initial subset of the encoded bits of the codeword and a repeated subset of the encoded bits of the codeword is mapped to the second subset of the PBCH bandwidth; and
means for performing a decoding process on the received subset of the encoded bits of the codeword to obtain the plurality of information bits, wherein respective sub-channels of the polar code assigned to the plurality of information bits are determined based at least in part on a number of encoded bits in the subset of encoded bits of the codeword.

25. The apparatus of claim 24, further comprising:
means for identifying that a signal-to-noise ratio (SNR) of the PBCH transmission over the first subset of the PBCH bandwidth is below a threshold.

26. The apparatus of claim 25, further comprising:
means for performing the decoding process on the received subset of the encoded bits of the codeword, the initial subset of the encoded bits of the codeword, and the repeated subset of the encoded bits of the codeword mapped to the second subset of the PBCH bandwidth to obtain the plurality of information bits.

27. The apparatus of claim 24, further comprising:
means for determining a failure of the decoding process.

28. The apparatus of claim 27, further comprising:
means for performing a second decoding process on the received subset of the encoded bits of the codeword, the initial subset of the encoded bits of the codeword, and the repeated subset of the encoded bits of the codeword mapped to the second subset of the PBCH bandwidth to obtain the plurality of information bits.

29. The apparatus of claim 24, wherein the means for receiving further comprises:
means for receiving the subset of the encoded bits of the codeword from a first orthogonal frequency-division multiplexing (OFDM) symbol and a second OFDM symbol in a frequency-first, time-second order.

30. The apparatus of claim 24, wherein the second signal transmission comprises a synchronization signal transmission.

\* \* \* \* \*